US007142991B2

(12) United States Patent
Hathaway et al.

(10) Patent No.: US 7,142,991 B2
(45) Date of Patent: Nov. 28, 2006

(54) VOLTAGE DEPENDENT PARAMETER ANALYSIS

(75) Inventors: David J. Hathaway, Underhill, VT (US); Douglas W. Stout, Milton, VT (US); Ivan L. Wemple, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 11/095,327

(22) Filed: Mar. 31, 2005

(65) Prior Publication Data

US 2006/0229828 A1   Oct. 12, 2006

(51) Int. Cl.
    *G06F 17/50* (2006.01)
(52) U.S. Cl. .................. 702/57; 716/1; 716/4; 716/5; 716/6; 716/10
(58) Field of Classification Search .............. None
    See application file for complete search history.

(56) References Cited

U.S. PATENT DOCUMENTS

| | | | |
|---|---|---|---|
| 5,555,506 A * | 9/1996 | Petschauer et al. ......... 703/13 |
| 5,568,395 A * | 10/1996 | Huang ........................ 716/4 |
| 6,990,420 B1 * | 1/2006 | Guo et al. .................. 702/79 |
| 7,039,891 B1 * | 5/2006 | Tetelbaum .................. 716/13 |
| 7,062,731 B1 * | 6/2006 | Tetelbaum .................. 716/4 |
| 2004/0002844 A1 | 1/2004 | Jess et al. .................. 703/14 |
| 2005/0251354 A1 * | 11/2005 | Guo et al. .................. 702/79 |
| 2005/0268260 A1 * | 12/2005 | Suaya et al. ................ 716/5 |
| 2005/0268264 A1 * | 12/2005 | Nagai ........................ 716/6 |
| 2006/0100830 A1 * | 5/2006 | Lee et al. ................... 703/2 |

OTHER PUBLICATIONS

*Worst-Case Circuit Delay Taking Into Account Power Supply Variations*; Dionysios Kouroussis, Rubil Ahmadi and Farid N. Najm; DAC 2004, Jun. 7-11, 2004, San Diego, CA; ACM 1-58113-838-8/04/0006; pp. 652-657.
*Vectorless Analysis of Supply Noise Induced Delay Variation*; Sanjay Pant, David Blaauw, Vladimir Zolotov, Savithri Sundareswaran, Rajendran Panda; ICCAD 2003, Nov. 11-13, 2003, San Jose, CA; ACM 1-58113-765-1/03/0011; pp. 184-191.
*First-Order Incremental Block-Based Statistical Timing Analysis*; C. Visweswariah, K. Ravindran, K. Kalafala, S.G. Walker and S. Narayan; DAC 2004, Jun. 7-11, 2004, San Diego, CA, ACM 1-58113-828-8/04/0006; pp. 331-336.

* cited by examiner

*Primary Examiner*—Carol S. W. Tsai
(74) *Attorney, Agent, or Firm*—Downs Rachlin Martin PLLC

(57) ABSTRACT

A method of, and a system for, determining an extreme value of a voltage dependent parameter of an integrated circuit design is provided. The method includes determining a plurality of current waveforms, each of the plurality of waveforms corresponding to one of a plurality of aggressor objects in the design of the integrated circuit; applying each of the plurality of current waveforms to a subset of the plurality of power bus nodes, the subset of the plurality of power bus nodes being designed to supply power to a corresponding one of the plurality of aggressor objects; determining a plurality of voltage waveforms, each of the plurality of voltage waveforms being at one of the plurality of power bus nodes and corresponding to one of the plurality of current waveforms; using the plurality of voltage waveforms to determine the extreme value.

28 Claims, 16 Drawing Sheets

VOLTAGE DEPENDENT PARAMETER ANALYSIS

FIELD OF THE INVENTION

The present invention generally relates to the field of integrated circuit design. In particular, the present invention is directed to a method of determining voltage dependent parameters in integrated circuit design.

BACKGROUND OF THE INVENTION

Various parameters in the design of an integrated circuit, or chip, have a significant dependence on power supply voltage. Examples of such parameters are delay values in static timing analysis and extreme voltage drop values. Variations in power supply and ground voltages between driving and receiving gates can also have an impact on such parameters.

The power supply and ground voltages will vary both spatially (across different locations on the chip) and temporally (in time). Given an average current demand at each location on the chip and an electrical (resistive) model of the chip and package power distribution network, various known power bus simulation methods may be used to determine average (non-time varying) power supply and ground voltages at different locations on the chip. Similarly, if time varying current demand waveforms for each location on the chip are provided along with an electrical (L, R, C) model of the chip and package power distribution network and decoupling capacitances, power supply simulation methods can compute corresponding voltage waveforms at different locations on the chip.

Average voltage values may be input to static timing analysis by using a different voltage (or set of supply, ground, driver supply, and driver ground voltages) in calculating delays for each circuit element, or block of circuit elements, on the chip. In an alternative, voltage waveforms may also be used in static timing analysis, but this requires sampling of the voltage (or voltages) for each circuit element at the time the signal transition is propagating through the block. In one existing commercial tool a first timing analysis is done to determine times during which each gate makes its critical transition(s). A second timing analysis is done in which the arrival times from the first analysis are used to determine the time at which the voltage waveform for a block should be sampled for use in delay calculation. The procedure is repeated, using arrival times from the most recent analysis to determine when to sample voltage waveforms to compute the delays for the next analysis. This iterative analysis can be inefficient.

A key problem is determining which conditions (and hence which average current demand or current demand waveforms) are the worst condition for timing. One method is to try to determine the maximum current demand subject to some constraints. A typical constraint is that the percentage of signals switching in any cycle does not exceed some bound. There may be both a global bound and a higher local bound for regions of a given size (e.g., no more than 15% of all chip nets switch, and no more than 30% of the nets in any 1 mm by 1 mm region switching in any cycle). Various heuristics are then used to try to determine a "worst case" switching scenario given these constraints.

A problem with this approach is that the maximum power condition may not cause the minimum timing margin. Most timing requirements on a chip are setup or hold tests at memory elements (e.g., flip-flops or latches), and constitute a comparison between a clock and data arrival time at the memory element. For a setup test the requirement is that the latest possible data transition in a cycle arrive at least a specified time before the earliest possible clock signal. For a hold test the requirement is that the earliest possible data transition in a cycle arrive at least a specified time before the latest possible clock signal. Thus, the worst case switching condition (and resulting voltage waveform) for a timing test is the one which causes the maximum change in the difference between a late signal arrival time and an early signal arrival time. Further, this method uses heuristics which give no guarantee that the maximum voltage reduction condition for blocks along any given path was actually discovered.

In addition to determining the impact that voltage fluctuations have on chip timing, it is desirable to understand the extreme voltage values which can occur at different locations within the power distribution network on a chip.

Previous methods for computing voltage bounds apply a particular set of current waveforms to the various nodes of the power supply network (possibly over many clock cycles), perform simulation to produce resultant voltage waveforms at each of the power bus nodes, and then determine extreme values of those voltage waveforms. The set of current waveforms applied model the current demand associated with a particular chosen pattern of activity for the various elements on the chip. This method is limited, in that the length of current waveform required to consider all possible patterns of current demand is extremely long. For example, if there are 10 different objects on the chip which can draw current in a particular waveform and current drawn in a particular clock cycle can affect the power supply node voltages for up to three cycles, a total of $2^{(10*3)}$ ($=2^{30}$) or over 1 billion cycles of current waveform must be simulated to consider all possible activity patterns. This is clearly prohibitive, and thus a more efficient means of determining extreme voltages is needed.

SUMMARY OF THE INVENTION

In one aspect, the present invention provides a method of determining an extreme value of a voltage dependent parameter of an integrated circuit design, the integrated circuit design having a plurality of power bus nodes. The method includes (a) determining a plurality of current waveforms, each of the plurality of waveforms corresponding to one of a plurality of aggressor objects in the design of the integrated circuit; (b) applying each of the plurality of current waveforms to a subset of the plurality of power bus nodes, the subset of the plurality of power bus nodes being designed to supply power to a corresponding one of the plurality of aggressor objects; (c) determining a plurality of voltage waveforms, each of the plurality of voltage waveforms being at one of the plurality of power bus nodes and corresponding to one of the plurality of current waveforms; (d) determining a logical expression to specify a subset of the plurality of current waveforms that can occur together; and (e) using the plurality of voltage waveforms and the logical expression to determine the extreme value.

In another aspect, the present invention provides a method of determining voltage extremes at a power bus node of an integrated circuit design, the integrated circuit design having a plurality of power bus nodes. The method includes (a) determining a plurality of current waveforms, each of the plurality of waveforms corresponding to one of a plurality of aggressor objects in the design of the integrated circuit; (b) applying each of the plurality of current waveforms to a subset of the plurality of power bus nodes, the subset of the plurality of power bus nodes being designed to supply power to a corresponding one of the plurality of aggressor objects; (c) determining a plurality of voltage waveforms at a selected one of the plurality of power bus nodes for each the plurality of current waveforms applied, each of the plurality of voltage waveforms having one or more clock cycles; and (d) using the plurality of voltage waveforms to determine an extreme voltage value for the selected one of the plurality of power bus nodes.

In yet another aspect, the present invention provides a computer readable medium containing computer executable instructions implementing a method of determining an extreme value of a voltage dependent parameter of an integrated circuit design, the integrated circuit design having a plurality of power bus nodes. The instructions include (a) a first set of instructions for determining a plurality of current waveforms, each of the plurality of waveforms corresponding to one of a plurality of aggressor objects in the design of the integrated circuit; (b) a second set of instructions for applying each of the plurality of current waveforms to a subset of the plurality of power bus nodes, the subset of the plurality of power bus nodes being designed to supply power to a corresponding one of the plurality of aggressor objects; (c) a third set of instructions for determining a plurality of voltage waveforms, each of the plurality of voltage waveforms being at one of the plurality of power bus nodes and corresponding to one of the plurality of current waveforms; (d) a fourth set of instructions for determining a logical expression to specify a subset of the plurality of current waveforms that can occur together; and (e) a fifth set of instructions for using the plurality of voltage waveforms and the logical expression to determine the extreme value.

In still another aspect, the present invention provides a computer readable medium containing computer executable instructions implementing a method of determining voltage extremes at a power bus node of an integrated circuit design, the integrated circuit design having a plurality of power bus nodes. The instructions include (a) a first set of instructions for determining a plurality of current waveforms, each of the plurality of waveforms corresponding to one of a plurality of aggressor objects in the design of the integrated circuit; (b) a second set of instructions for applying each of the plurality of current waveforms to a subset of the plurality of power bus nodes, the subset of the plurality of power bus nodes being designed to supply power to a corresponding one of the plurality of aggressor objects; (c) a third set of instructions for determining a plurality of voltage waveforms at a selected one of the plurality of power bus nodes for each the plurality of current waveforms applied, each of the plurality of voltage waveforms having one or more clock cycles; and (d) a fourth set of instructions for using the plurality of voltage waveforms to determine an extreme voltage value for the selected one of the plurality of power bus nodes.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 1:
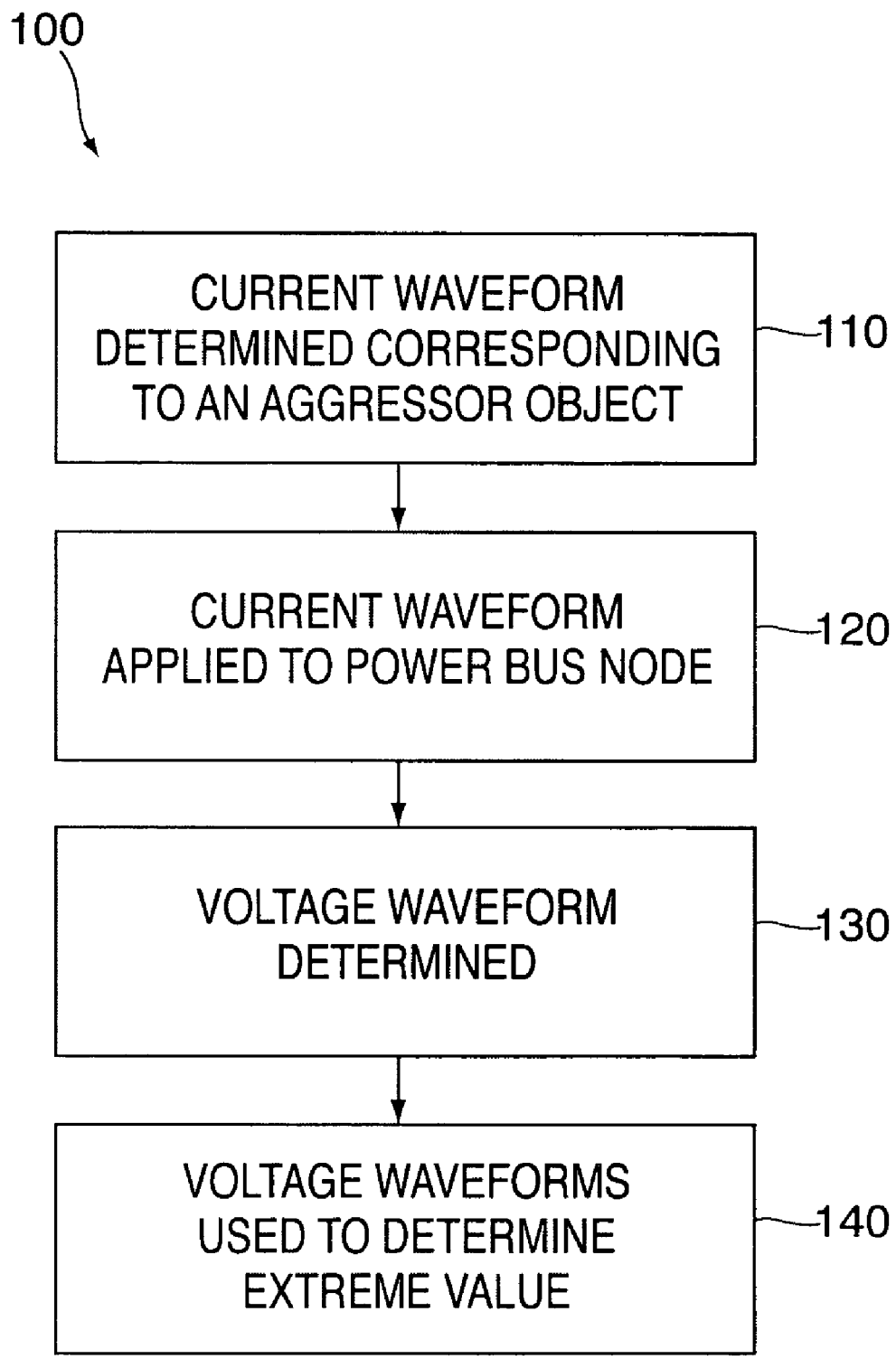
FIG. 1 is a flow diagram of an exemplary method of the present invention.
Figure 2:
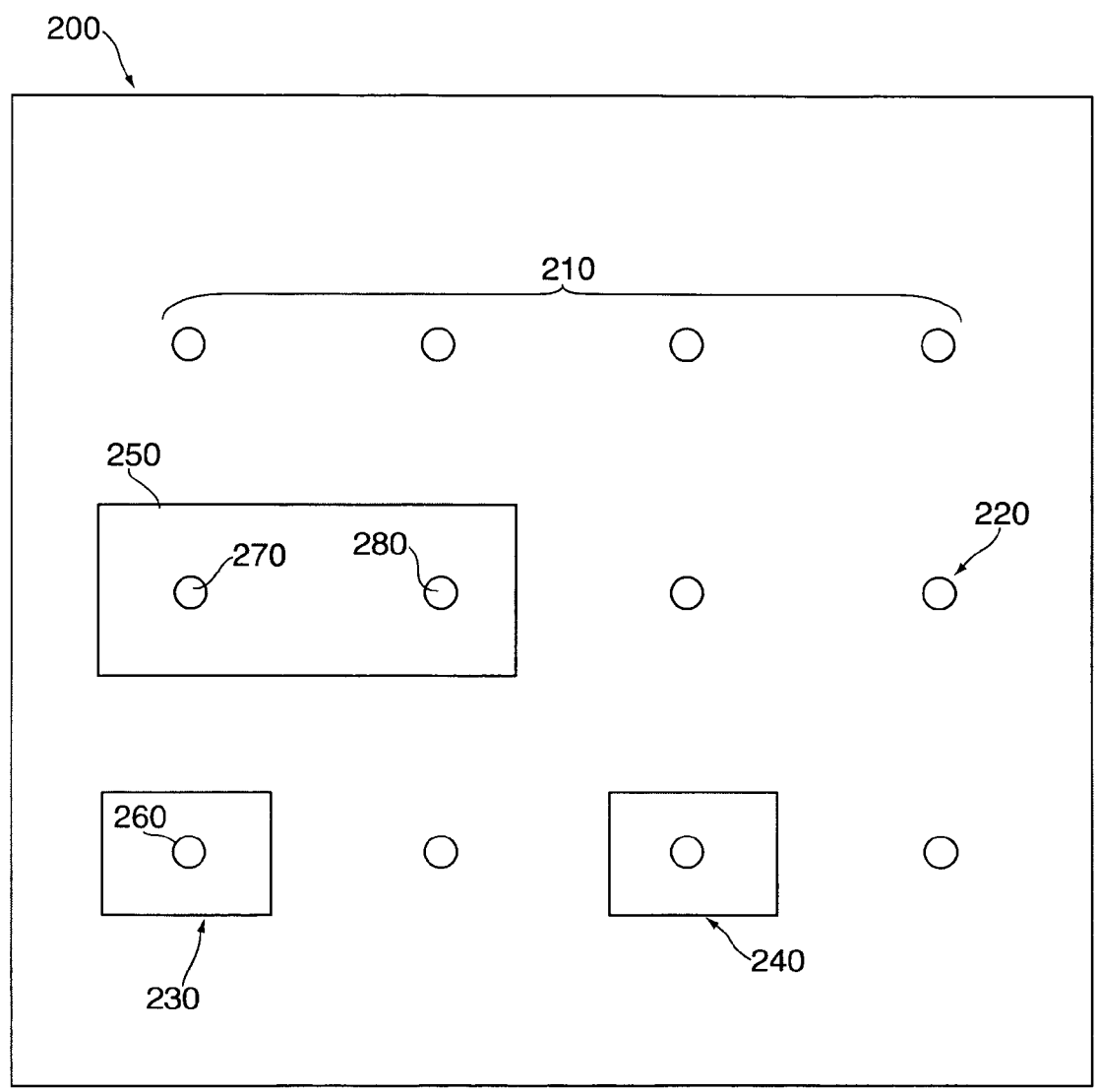
FIG. 2 is a simplified view of an example integrated circuit design.

Referring to FIG. 1, in one embodiment of the present invention, a method 100 of determining an extreme value of a voltage dependent parameter of an integrated circuit design is illustrated. Referring now to FIG. 2, a simplified view of one example of an integrated circuit design 200 that may be the subject of inquiry using method 100 is illustrated. Integrated circuit design 200 includes a power bus network 210 having power bus nodes, such as power bus node 220. Integrated circuit design 200 also includes aggressor objects 230 and 240. Integrated circuit design 200 is simplified for this discussion and one of ordinary skill will understand that an integrated circuit may include a variety of power bus structures and have a variety of types and numbers of aggressor objects.

A chip power distribution network may have more than one power bus network. Examples of power bus networks that may be present in an integrated circuit design include, but are not limited to, one or more Vdd network, one or more ground networks, special purpose analog power and I/O (input output circuit) power networks, and any combinations thereof. Multiple Vdd or ground power networks may be used to allow power to selected portions of the chip to be switched off, or to allow different portions of the chip to operate at different voltages. A power bus node, such as power bus node 220, may represent the corresponding nodes of each of the various power bus networks at a particular chip location. When multiple power bus networks converge at a single power bus node, a voltage at a particular power bus node may include a voltages of one of the various power bus networks at the node location, a difference between a pair of these voltages, or any combination of the voltages.

An aggressor object, such as aggressor objects 230 and 240, may be a single switching element in the integrated circuit design or a group of switching elements. In one example, a large block, such as a memory array or a processor core, may be treated as a single aggressor object. In another example, collections of smaller circuit objects, which are in close physical proximity may be treated together as a single aggressor object. In yet another example, circuit objects from different areas of the integrated circuit design, which are known to have correlated switching activity, may be treated together as a single aggressor object.

Referring again to FIG. 1, at step 110 a current waveform is determined that corresponds to each of the aggressor objects on an integrated circuit design, such as aggressor objects 230 and 240 of integrated circuit design 200. The current waveform represents the current that would be drawn from the power bus network if the aggressor object is active in a particular clock cycle, t. Examples of ways to determine a current waveform for an aggressor object include, but are not limited to, circuit simulation, extraction from a pre-characterized power rule, hardware measurements from a previously manufactured instance of the object, and any combinations thereof. In one example, a current waveform may be determined for a single circuit element aggressor object from circuit simulation of the single circuit element. In another example, a current waveform may be determined by adding waveforms for different constituent objects comprising an aggressor object. In still another example a current waveform may be synthesized from a power estimate for an object and signal arrival time windows on pins (electrical signal connection points) of the object. A waveform for an aggressor object may represent varying degrees of switching activity in a particular clock cycle depending on the characteristics of the aggressor object. In one example, a waveform of an aggressor object may be completely present or completely absent in a particular clock cycle, such as with an SRAM (static random access memory) aggressor object, which may have either a read/write operation or no operation at all in a particular cycle. In another example, a current waveform of an aggressor object may represent partial switching of the circuit element. In yet another example, a current waveform of an aggressor object may represent a single literal current waveform applied at a single node of a power distribution network or a collection of current waveforms applied at a set of power bus nodes.

At step 120, each current waveform determined at step 110 is applied to a power bus node designed to supply power to the aggressor object to which the current waveform corresponds. For example, referring to FIG. 2, a current waveform corresponding to aggressor object 230 would be applied to power bus node 260. In another example, a current waveform corresponding to aggressor object 250 would be applied to power nodes 270 and 280. The application of the current waveform to the power bus nodes can be done by modeling (such as with a linear electrical model) the power distribution network of the integrated circuit design. An electrical modeling may include power distribution network elements, such as resistive, capacitive, and inductive elements at various levels of the integrated circuit environment, including, but not limited to, the chip level, the package level, the board level on which the chip package is designed to be mounted, and any combinations thereof. Power distribution network elements that may be present in such a model include, but are not limited to, a package power bus, a chip power bus, a decoupling capacitor, a wirebond package connection, and any combinations thereof. In one example, an electrical model may include resistances between a power supply and ground to represent a damping effect of static currents and/or average dynamic currents (i.e., the fact that the current drawn between a pair of supply and ground power bus nodes will decrease as the voltage applied across the power bus nodes decreases). In another example, static current demand such as that resulting from unavoidable leakage current and other causes may be included in the current waveforms determined for a particular aggressor object.

The application of a current waveform may be done with any applied power supply voltage to the power distribution network. In one example, the applied power supply voltage is zero resulting in a measured voltage representing the negative of the voltage drop, $V_{drop}$, (i.e., the difference between the ideal voltage with no current load and the voltage with the aggressor current applied). In another example the applied voltage is the nominal power supply voltage and no aggressor current is applied, resulting in node voltages at each power supply node due to static resistive connections between the power supply networks (e.g., between Vdd and ground). Such a simulation may also include the static currents associated with various chip elements which are drawn from the power supply network independent of switching activity. Other applied power supply voltages may be used, such that the sum of various combinations of resulting voltage waveforms will properly reflect the voltage if the corresponding combination of voltage and current sources is applied.

In step 130, a voltage waveform corresponding to a current waveform applied is determined at a power bus node of the power bus network. For each current waveform determined in step 110 and separately applied in step 120, a voltage drop waveform can be measured at all power bus nodes of the power bus network or a representative subset of the power bus nodes. In one example, a current waveform is simulated for one cycle of the current waveform and a voltage waveform is determined until its magnitude decreases to some specified level, such as a terminal zero. It should be noted that in certain situations, such as in the presence of inductance, a resulting voltage waveform may oscillate. Decay to a certain threshold can be checked against the peaks of the damped oscillation and not merely stopped when the magnitude crosses zero. A duration of a voltage waveform may be longer than the single cycle of the current waveform for which it was simulated. For example, a voltage waveform may extend for N cycles of aggressor object activity. The resulting voltage waveforms for all power bus nodes of the power distribution can be stored for later use, for example as in step 140.

Power supply noise causes the voltage at a power bus node of the power distribution network to vary from its ideal value, where the ideal voltage value at a node is the voltage applied to the input nodes of the power net of which the node is a part. In one example, this would be the voltage applied to the wire bond pads or solder bumps through which the power supply voltage is introduced to a chip. In another example, it would be the voltage applied to chip package pins. The term voltage drop as used herein will refer to any variation from an ideal voltage. A positive voltage drop will be taken to mean a voltage reduction for power supply nets such as Vdd for which the dominant current flow is onto the chip, and will also be taken to mean a voltage increase for power supply nets such as ground for which the dominant current flow is out of the chip. Thus a voltage drop waveform will be the negative of the voltage waveform resulting from simulation of the power distribution network with the application of the aggressor current waveform. A voltage waveform obtained from the simulation for use in subsequent steps of the inventive method may include without limitation, a voltage drop waveform, a voltage waveform from simulation without negation, a difference between two voltage waveforms from simulation, or any combinations thereof.

In another example, a voltage waveform that would result at a power bus node due to multiple aggressor objects switching in multiple cycles may be determined by adding the voltage waveforms at the power bus node resulting from the multiple aggressor objects to the ideal supply voltage, or to the node voltages determined by simulating the power supply network with only the ideal power supply voltage and static current sources applied. It will be understood that references hereinafter to ideal voltages may refer either to an actual ideal applied voltage or to a node voltage determined by simulating the power supply network with only the ideal power supply voltage and static current sources applied. Impact of past cycles of switching activity by a particular aggressor object can be modeled by adding time-shifted versions of the voltage waveform at a given power bus node for that aggressor object. For example, if a voltage waveform at a power bus node, j, for a particular aggressor object, i, is Vij(t), the contribution of the aggressor object switching k cycles ago (cycle length T) would be modeled by voltage waveform Vij(t+kT).

In yet another example, an average or typical weighting (w_nom(i)) for the activity of each object i, and consequently an average or typical weighting for its current waveform can be determined. These weightings can be numbers between zero and one. An average or typical voltage waveform at each node in the network may then be determined by taking the weighted average of the resulting waveforms at that node from the simulations of the current waveforms for all the objects. Since the simulations from which the voltage waveforms were derived were driven by only a single cycle of object activity, but an object may be active in successive cycles of the system, this weighted average should also include multiple time-shifted copies of a waveform. Since the average activity is generally considered to be time-invariant, the weighting for all time-shifted copies of the voltage response waveforms for a particular object will normally be the same.

Figure 3:
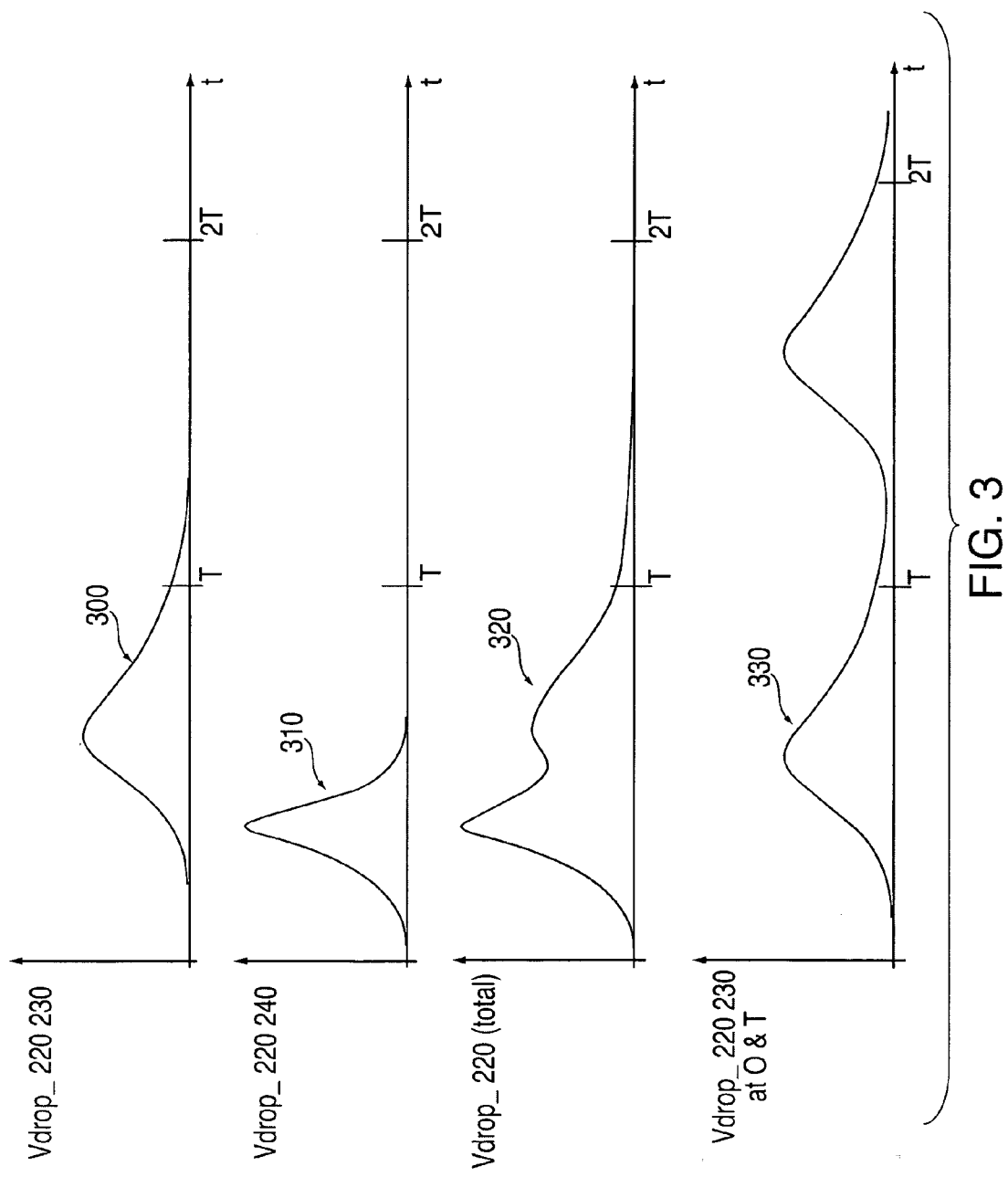
FIG. 3 shows an example superposition of voltage waveforms.

Referring to FIG. 3, example voltage drop waveforms 300 and 310 determined at power bus node 220 are illustrated. Voltage drop waveforms 300 and 310 correspond to current waveforms for aggressor objects 230 and 240, respectively. Voltage drop waveform 320 corresponds to the superposition of voltage drop waveform 300 and voltage drop waveform 310. Voltage drop waveform 330 corresponds to the superposition of voltage drop waveform 300 due to aggressor object 230 at two different times. Due to the linearity of the power distribution network, voltage drop waveform 320 is equivalent to the result which would have been obtained had the current waveforms for objects 230 and 240 been applied in the same cycle in a single simulation, and voltage drop waveform 330 is equivalent to the result which would have been obtained had the current waveform for object 230 been applied in two successive cycles in a single simulation.

At step 140 voltage waveforms determined at step 130 are used to determine an extreme value of a voltage dependent parameter. Examples of voltage dependent parameters include, but are not limited to, a minimum delay, a maximum delay, a worst-case slack value, a best-case slack value, a minimum voltage drop value, a maximum voltage drop value, a maximum node voltage, and a minimum node voltage. In one example, an extreme value of a voltage dependent parameter is an extreme slack value. In another example, an extreme value of a voltage dependent parameter is an extreme voltage drop value.

In some cases fluctuations of voltage within a clock cycle will be much smaller than those between cycles. One example of this may occur includes very fast clocks and package inductances that result in low resonant frequencies for the power distribution network. In such cases examples of constant behavior include, but are not limited to, the current demand from an object may be considered constant, the voltage of a power bus node during a cycle may be considered constant, or both. If the voltage during a cycle is considered constant, an average scalar voltage, or a set of scalar voltages in each of several cycles including and following the cycle in which the current waveform or scalar value was applied, may be generated at each power bus node of the network in step 130, rather than an average voltage waveform. If the current during a cycle is considered constant, a (scalar) total charge drawn from the power distribution network by an aggressor object may be determined in step 110 rather than a waveform, and the current waveform used for the particular aggressor object in the simulation in step 120 above may be any waveform of one cycle duration whose integral matches this total charge (e.g., a square pulse, triangular pulse, etc.).

Figure 4:
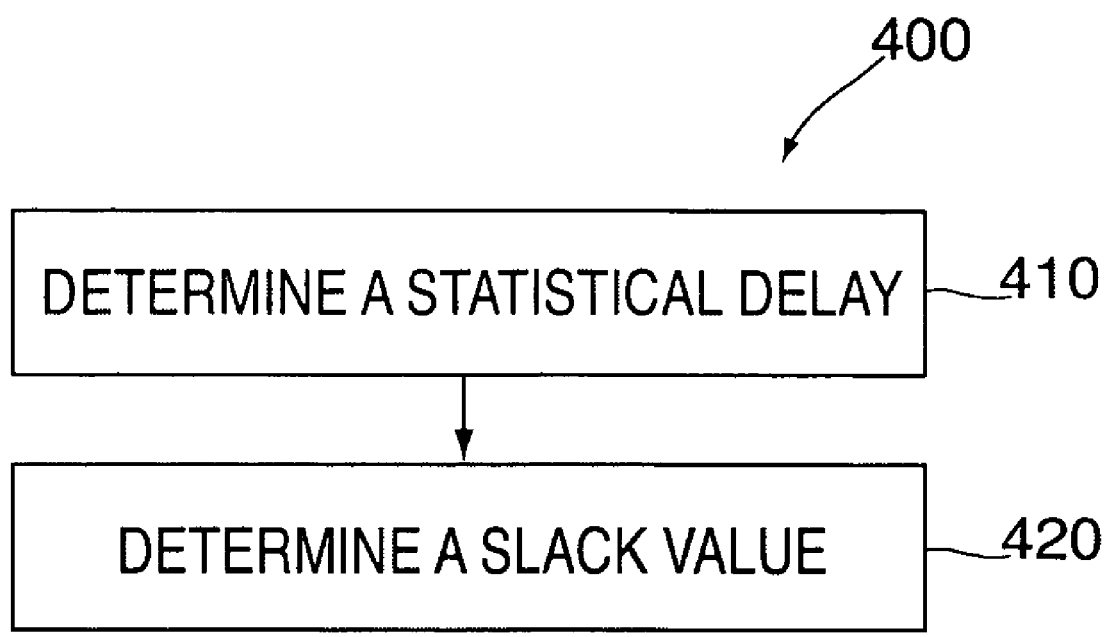
FIG. 4 is a flow diagram of an example step of one method of the present invention.

In one embodiment, a method of determining an extreme voltage dependent parameter of a static timing analysis is illustrated in FIG. 4. In this example, step 140 of FIG. 1 is performed by a method 400. At step 410 a dependence on voltage for each delay of each circuit element for which timing is to be analyzed is determined using one or more voltage waveforms that have been simulated. In one aspect, this may be done using a locally linear model expanded about some nominal voltage, where that nominal voltage could be the ideal supply voltage, but can also be an average voltage. In one example, the voltage employed is a time average of the average voltage waveform at the power bus node from which the circuit element draws its power, or the scalar average voltage at the power bus node. A delay of a first circuit element that is fed by a second circuit element may depend on the power supply voltage, ground voltage, and/or other voltages of both the first and second circuit elements. To determine a delay of a particular circuit element, the voltage waveforms corresponding to one or more power bus nodes near the circuit element are used. In one example, a voltage waveform used to derive a delay for a particular circuit element may be a voltage waveform corresponding to a single power bus node located near (or supplying power to) the circuit element. In another example, for a circuit element that is located between (or receiving power from) a plurality of power bus nodes, a voltage waveform used to determine a delay may be derived from voltage waveforms corresponding to each of the impacted power bus nodes between which the circuit element is located. In deriving the voltage waveform to be used in this multiple power bus node example, voltage waveforms corresponding to the impacted power bus nodes may be used in a variety of ways. Examples of ways of using the impacted power bus node voltage waveforms include, but are not limited to, using a maximum of voltage waveforms at the power bus nodes (for example, in a minimum delay calculation), using a minimum of voltage waveforms at the power bus nodes (for example, in a maximum delay calculation), using a weighted average of the voltage waveforms at the power bus nodes, and any combinations thereof. In one example of a weighted average, a circuit element that is separated from a first power bus node having a voltage of $V_1$ by a distance of $d_1$ and from a second power bus node having a voltage of $V_2$ by a distance of $d_2$, the voltage used for determining a delay associated with the circuit element may be determined by $(d_2*V_1+d_1*V_2)/(d_1+d_2)$.

In one example, a statistical delay is determined by using a block-based statistical timing analysis in which the weightings for the various aggressor object current waveforms in different cycles are the statistical parameters. An example of block-based statistical timing analysis is set forth in Visweswariah, et al. "First Order Incremental Block Based Statistical Timing Analysis," 2004 Design Automation Conference, pp. 331–336 and U.S. Patent Application Publication No. 2004/0002844 A1 to Jess et al., both of which are incorporated herein by reference as if set forth in their entirety. In this example, using a nominal value for each parameter will yield a mean delay and mean arrival time. A sensitivity of a delay of a circuit element to the weighting for a particular aggressor object current source switching in a particular cycle may be determined from a voltage induced by that current source at a power bus node to which the circuit element is connected, sampled from the resulting waveform at its nominal arrival time. In one example, delay calculations are ordered so that the delay through a circuit element is computed after the arrival at the block input has been computed. This allows for efficient calculations in a single pass.

A delay computation may be performed on each edge of a timing graph, in which the graphical nodes of the graph represent points in an integrated circuit design between which signals can propagate and which arrival times (ATs) can be determined. The edges of the timing graph can represent a direct connection between these graphical nodes along which signals can propagate and on which delays may be computed. In a block-based statistical timing analysis the arrival time at the inputs of a circuit element are generally computed before the delays for the circuit element are computed. Thus, the inputs to the statistical delay computation process for a timing graph edge are the statistical arrival time at the circuit element input, a delay rule or other data allowing the computation of the delay as a function of the circuit element supply voltage, and the set of voltage waveforms resulting from the various aggressor object activities.

One aspect of such an analysis is the representation of delays, arrival times, and slacks as statistical functions of the form:

$$x = x_0 + \sum_{i=1}^{N} x_i * p_i$$

where $x_0$ is a nominal or mean value, $p_i$ is the ith statistical parameter, and $x_i$ is the sensitivity or derivative of the value to the ith statistical parameter. A statistical parameter will be associated with each aggressor object in each of one or more cycles, and the value of the statistical parameter represent whether (or the degree to which) the corresponding aggressor object is switching in that cycle. Other aspects include computing a statistical sum or difference of two statistical values (by taking the sum or difference of their respective $X_0 \ldots X_N$ components) and computing the statistical maximum and/or minimum of two statistical values.

Referring again to FIG. 4, at step 420 a slack value is determined. A slack value can be used in a any one of a number of timing tests. Examples of timing tests include, but are not limited to, setup, hold, pulse width, pulse separation, jitter, clock gating. In one example, a slack value is modeled as a linear combination of the current weighting parameters and can be determined from $$slack = slack_{nom} + \sum_{i=1}^{N} (sensitivity_i * w_i)$$

where i represents each statistical parameter, $w_i$ represents a value of an ith statistical parameter, and sensitivity$_i$ represents the derivative of the slack with respect to that statistical parameter. In another example, a hold test slack value can be determined as early data arrival time minus late clock arrival time minus a hold requirement. A hold requirement can be a statistical value. In yet another example, a setup test slack value can be determined as early clock arrival time minus late data arrival time minus a setup requirement. A setup requirement can be a statistical value. Setup and hold requirements may be obtained by various means, including but not limited to, computation from precharacterized timing rules, and circuit simulation.

It will be understood by those of ordinary skill that several circuit paths may converge on a circuit object that is subject to a timing test. It is possible that each of the circuit paths may have probabilities of having maximum or minimum arrival times. Block-based statistical timing analysis may be used to determine binding probabilities to select multiple paths (i.e., multiple parametric slack equations for each test) that can be analyzed. In another example, other parameters related to process or other factors, other than those based on the current waveforms discussed above, can be defined and used in a block-based statistical timing analysis.

It should also be noted that the two paths (generally clock and data) leading to a timing test may traverse some of the same circuit elements (or blocks), and that signals which traverse these circuit elements at different times (e.g., in different clock cycles) may end up being compared at a test. For example, a setup test may use a clock which passes through a particular clock buffer in one cycle to launch a data signal, and a clock which passes through the same clock buffer in the following cycle to capture the data. If the data signal passes through transparent latches (i.e., latches through which data may propagate directly without being synchronized by the latch clock signal) or through multi-cycle paths, more than a single cycle may separate the times at which voltage samples should be taken to compute the delays of an object in a pair of data and clock paths involved in a timing test. A similar situation arises in jitter analysis, which examines variation in the period between the arrival times of a signal at a point (e.g., a chip output) in different clock cycles. Thus, different delays may need to be computed for the same circuit element, using voltage samples taken at different times, or equivalently, using different time shifts of the voltage waveforms computed for the various aggressor objects, and one must propagate multiple statistical arrival time functions through certain points in the network during a single analysis.

One example of how to achieve this is to determine the maximum number of cycles required for the complete propagation of any path under analysis. The statistical timing analysis will then compute that many separate delays and arrival times for all edges and graphical nodes in the timing graph. In another example, a backward propagation may be performed from each timing test (e.g., a setup test, hold test, or a point at which a jitter computation is to be made). The relative cycle of the values being compared at a timing test is first determined. For example, for a hold test the clock and data arrival times are typically taken from the same cycle, while for a setup test the data arrival time is taken from one cycle before that from which the clock arrival time is taken. Assuming the cycle in which the test is performed is cycle zero, the set of cycles for which a delay or arrival time is needed is determined during the backward propagation. As the backward propagation passes through a transparent latch or another edge of the timing graph along which a cycle adjust of an arrival time is performed, the number of cycles being adjusted for the point is subtracted from each of the set of cycles required at the point. For example, if at the output of a transparent latch arrival times for cycles 0 and −2 are required, at the input of the transparent latch arrival times for cycles −1 and −3 would be required. When in the backward propagation two paths converge (i.e., at a point where a signal fans out to multiple sinks), the set of cycle times for which arrival times and delays are required at the convergence point is the union of the sets from the two converging paths. For example, if an AND gate fans out to one sink which requires arrival times from cycle 0 and to another sink requiring arrival times from cycle −1, the AND gate output would require arrival times for both cycles 0 and −1.

In this example, once the set of cycles for which arrival times are required is determined for all points in the timing graph, the forward propagation of arrival times and calculation of delays may proceed. For example, consider a gate at power distribution node j with input arrival time t, requiring a delay computed for cycle x. Assume that the voltage response for a single cycle current waveform simulation lasts for M+1 cycles, that the weighting parameter for object i in cycle k (k ranging from −M to 0) is w(i,k), and that the voltage waveform at node j caused by the aggressor current of object i is $v_{ij}(t)$. Then the voltage $V_j$ used to calculate the delay will be $$V_j = \sum_i \left\{ \sum_{k=-M}^{x} \{w(i,k) * vij(t + (x-k)T)\} \right\}$$

For example, if M=2 and x=−1, the voltage $V_j$ will be $$V_j = \sum_i \{w(i, -2) * v_{ij}(t + T) + w(i, -1) * v_{ij}(t)\}$$

Note that although M is 2 and therefore M+1=3 cycles of voltage waveform exist, only two terms appear in the summation, because the waveform for the current cycle (cycle 0, with weight w(i,0) has not yet started in cycle x=−1 for which the voltage sample is required.

As an arrival time is propagated across an edge to which a cycle adjust is applied, the arrival times are relabeled. For example, an arrival time for cycle q which is adjusted back one cycle while propagating through a transparent latch will become an arrival time for cycle q+1 at the transparent latch output.

The block-based statistical timing method described samples waveform voltages at a nominal or mean arrival time at a circuit element input. The actual arrival time and hence the best voltage sample value to use to accurately determine a slack for a particular assignment of statistical parameter values may differ from this mean value. Thus additional accuracy may be obtained by determining each set of variable assignments which results in a worst slack value for some timing test (note that one assignment may cause the worst slack for many timing tests). A separate nonstatistical timing analysis may then be performed for each such assignment. The benefit of these additional steps is that voltage samples at a block input used to compute the delay of that block will be based on an arrival time computed using delays corresponding to a particular predicted worst case statistical parameter, rather than from an average or mean statistical parameter assignment, enabling a more accurate estimate of the correct voltage to use for each delay calculation.

Figure 5:
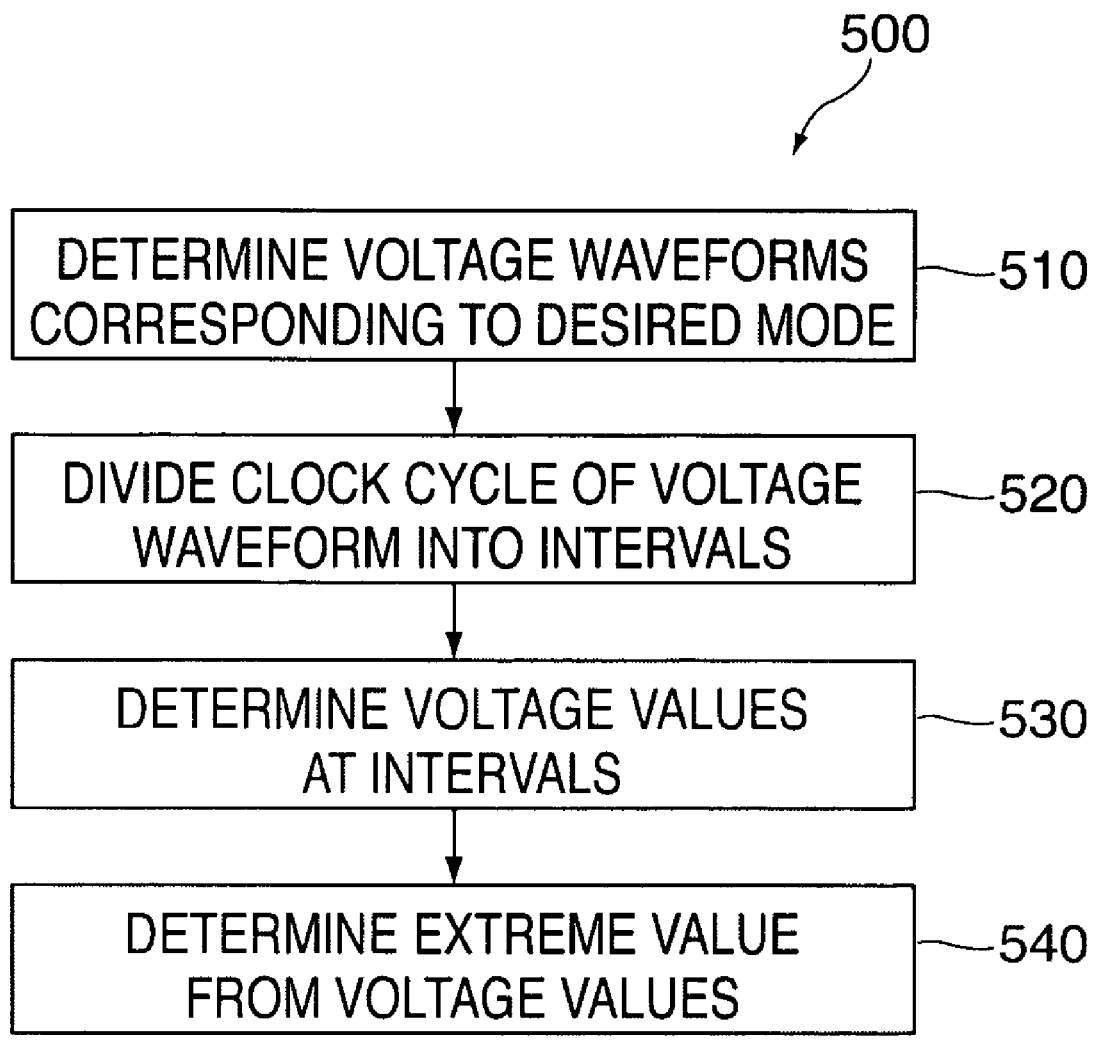
FIG. 5 is a flow diagram of an example step of one method of the present invention.

In another embodiment, a method of determining an extreme voltage dependent parameter of a maximum voltage drop and/or a minimum voltage drop (maximum overshoot) on a power bus node is illustrated in FIG. 5. To determine either a maximum voltage drop or a minimum voltage drop, the voltage drops waveforms corresponding to an aggressor objects switching activity in the present cycle and previous cycles may be used. In one example, voltage drop extremes are desired from any time within a particular clock cycle. At step 510, voltage waveforms corresponding to the power bus node of interest are determined. At step 520, each clock cycle in a voltage waveform can be divided into a number of offsets. The size of the step between different offsets can be determined based on a tradeoff between accuracy and run time. A smaller step requires more run time but provides a more accurate estimate of an extreme voltage drop value. At step 530, voltage values are sampled at each interval of each voltage waveform for the power bus node whose maximum or minimum voltage drop is being determined. At step 540, an extreme voltage value is determined from sampled voltage values. The maximum voltage value at a power bus node is the maximum of the maximum voltages determined for that power bus node over all time offsets within the cycle.

Figure 6:
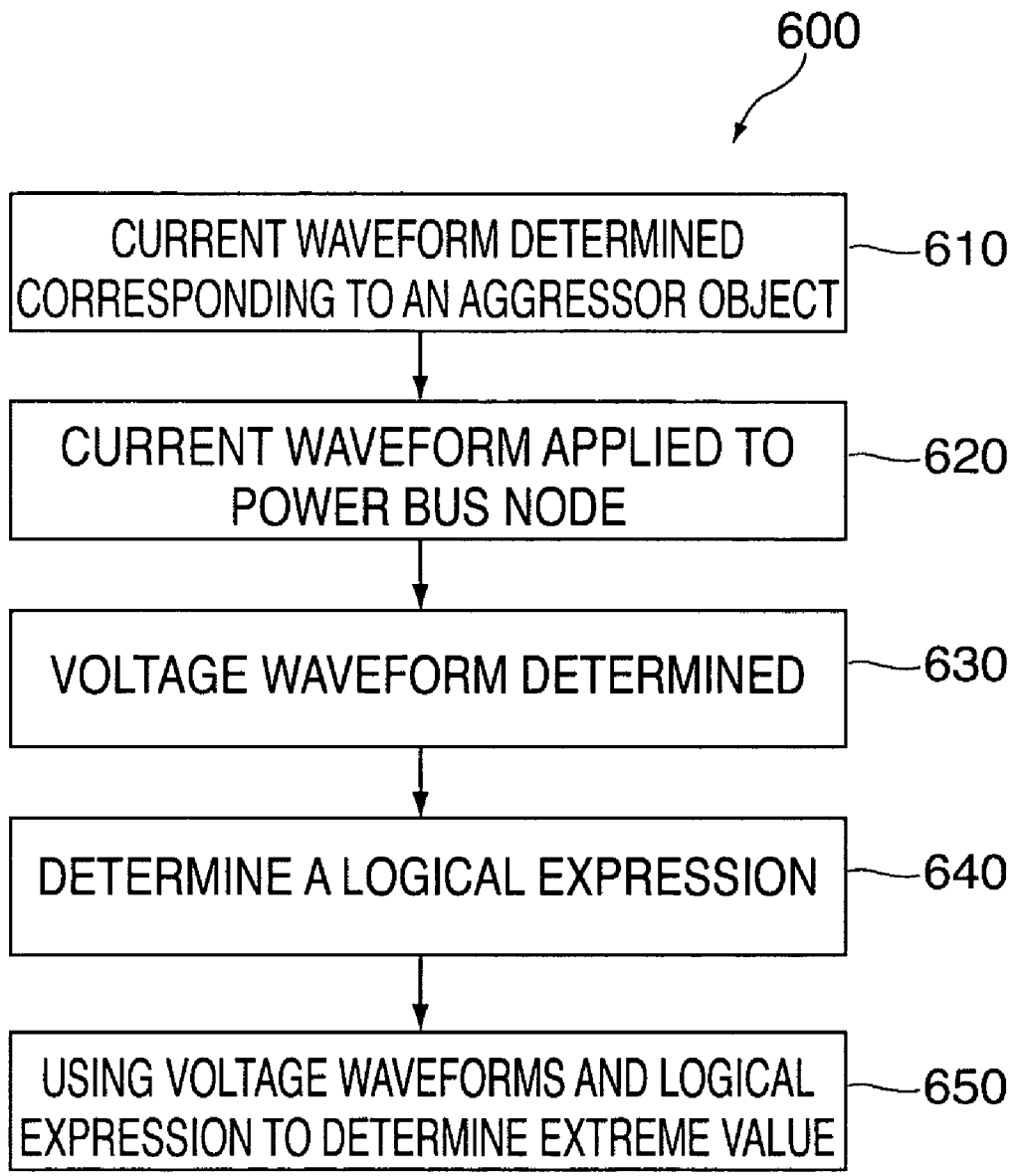
FIG. 6 is a flow diagram of an example method of the present invention.

Referring to FIG. 6, another example of a method according to the present invention is illustrated as method 600. Steps 610, 620, 630 are similar to steps 110, 120, and 130, respectively, of the method of FIG. 1. At step 640 a logical expression is determined to specify a subset of current waveforms that can occur together. The logical expression represents allowable combinations of aggressor objects switching in various cycles. By eliminating non-allowed switching combinations in a given cycle, the impact of these aggressor object combinations will be eliminated from extreme voltage dependant values calculated and improve the accuracy of the model. Examples of data structures which may be used to represent a logical expression include, but are not limited to, a binary decision diagram (BDD), a sum of products (SOP), a product of sums (POS), a truth table, and a general Boolean expression. In one example, a logical expression is stored as a reduced ordered BDD, which is well-known to those of ordinary skill in the art. One benefit to using a BDD includes the ability to use one BDD for an entire analysis. Although considerable effort may be required to optimize variable ordering in reducing a BDD size to minimize run time of each step in an analysis, once generated a single BDD can be used throughout the analysis. In another example, a BDD can have a variable for each cycle of each aggressor object. When the variable is set to a value of one this represents the aggressor object switching in the corresponding cycle. At step 650 the logical expression and voltage waveforms are used to determine an extreme value of a voltage dependant parameter, such as a worst case slack. This may be done using a BDD representation of the logical expression by finding the extreme weighted path from the root of the BDD to its 1 terminal node, where weights on nodes represent the sensitivities of the voltage-dependent parameter whose extreme value is being found to the variable for the node and the weight on the 1 terminal node represents a nominal value for the voltage-dependent parameter whose extreme is being found.

In another example, various "clock dithering" schemes which smooth out a transition from a clock gated condition for a macro to an ungated condition may be tested. Using a logical expression, such as a BDD, schemes can be compared to choose one that allows a maximum number of active clock cycles when turning on a clock, or the minimum number of active clock cycles when turning off a clock while still meeting a constraint on the extreme values of a voltage dependent parameter.

In another aspect, a logical expression may be generated for at least one timing test indicating the conditions under which the timing test must be met. For example, a setup time for data input to an SRAM must only be met if the data is to be written to the SRAM. So a worst case variable assignment for aggressor object switching for such a timing test which indicates that the SRAM is not written in that cycle is not meaningful. In this example, such a condition can be represented as a "care" condition for the test. One example of a way to model this includes logically expressing the care condition as an AND with an allowable switching conditions expression and finding a minimum weighted path through the resulting BDD for that test. Another example of a way to model this includes, where a particular variable is not allowed to be one (or zero) for a particular test, setting the slack sensitivity to it in its disallowed state to a very large positive value, indicating that when the variable is in that state the slack will be positive regardless of the assignment of the other variables.

EXAMPLE ONE

Figure 7:
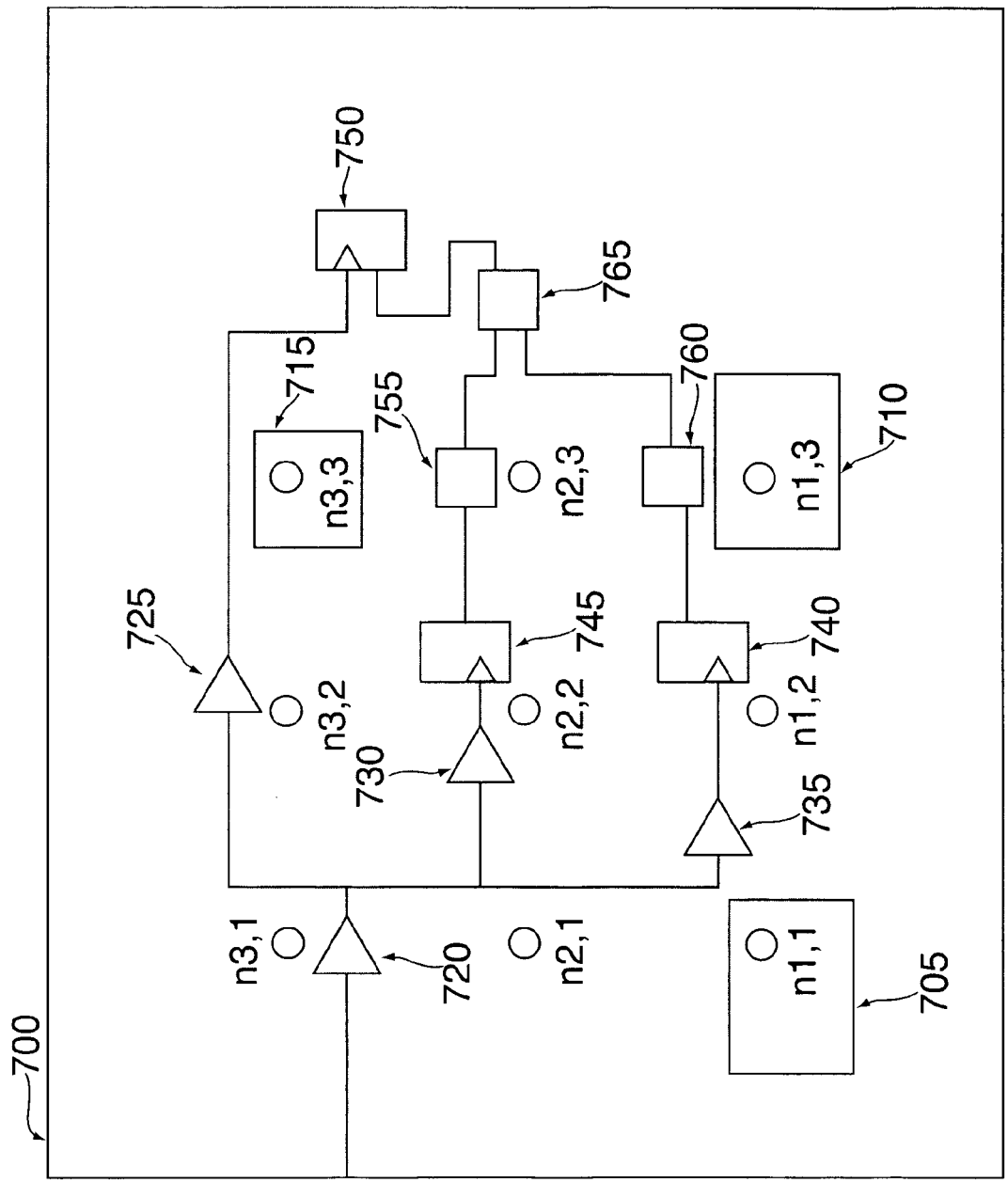
FIG. 7 is a simplified view of an example integrated circuit design.
Figure 8:
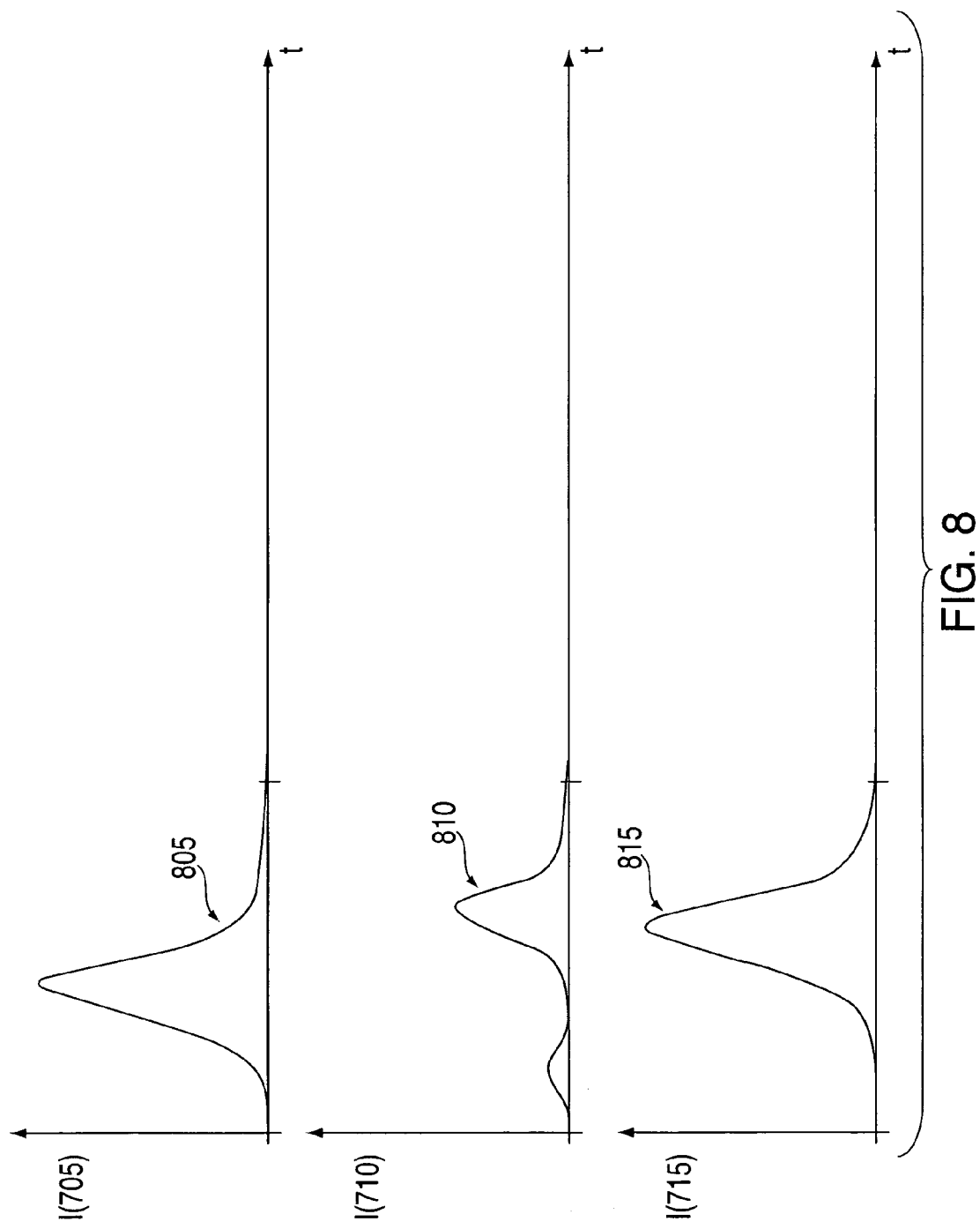
FIG. 8 shows example current waveforms.
Figure 9:
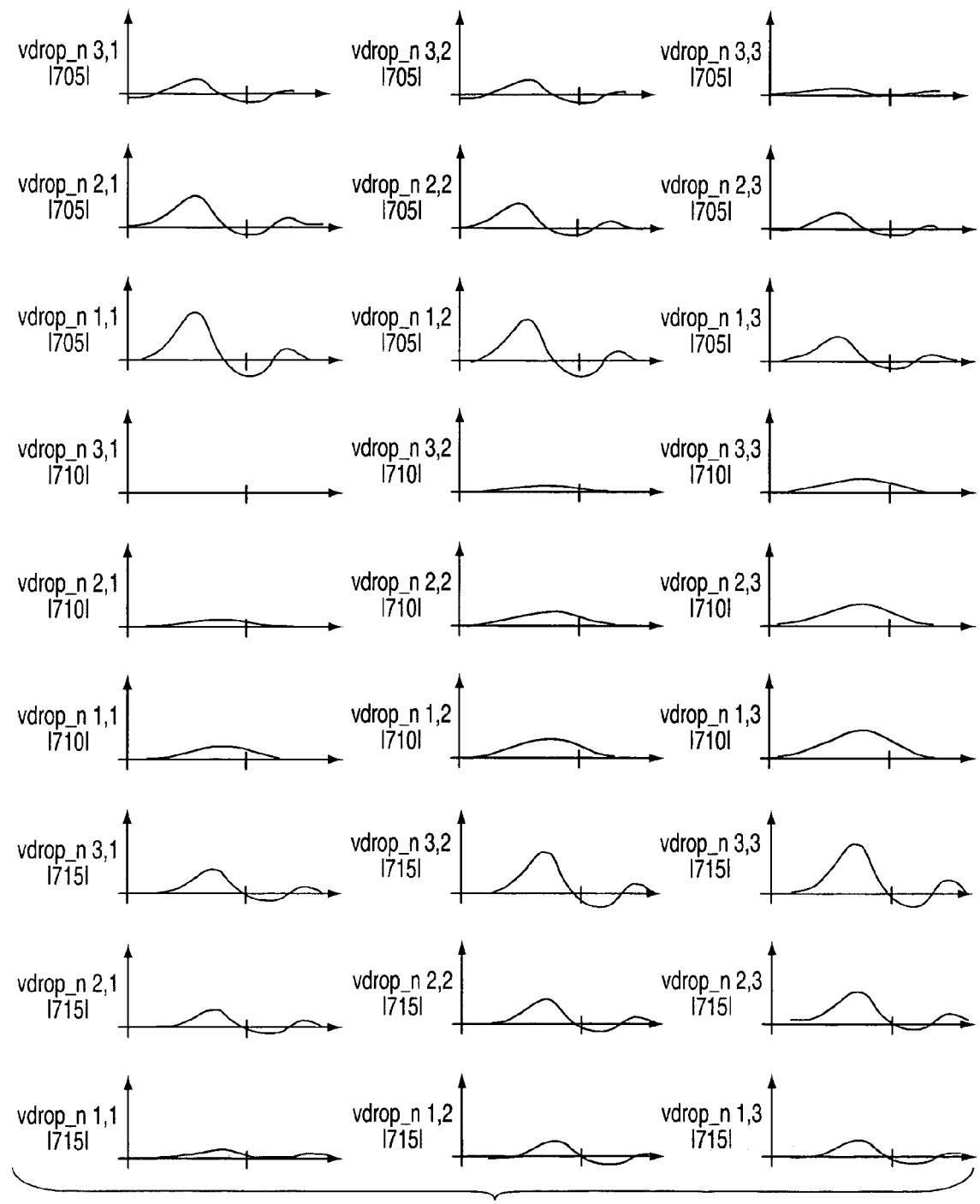
FIG. 9 shows example voltage waveforms.

In this example, an extreme value of a voltage dependent timing parameter is determined. Referring now to FIG. 7, an example integrated circuit design 700 is illustrated. For simplicity of this example, three aggressor objects 705, 710, and 715 are shown. As discussed above, any number of aggressor objects may be identified in a given integrated circuit design. Current waveforms for each aggressor object 705, 710, and 715 are determined. FIG. 8 illustrates example current waveform 805 corresponding to aggressor object 705, current waveform 810 corresponding to aggressor object 710, and current waveform 815 corresponding to aggressor object 715. Referring again to FIG. 7, integrated circuit design 700 includes nine power bus nodes, n1,1 to n3,3. In this example, each of current waveforms 805, 810, 815 is applied to one or more power bus nodes supplying the corresponding aggressor object with power. This is done in this example with a zero applied power supply voltage. In this example, aggressor object 705 is supplied by power bus node n1,1, aggressor object 710 is supplied by power bus node n1,3, and aggressor object 715 is supplied by power bus node 3,3. For each individually applied current waveform 805, 810, 815 a voltage waveform is determined at each of power bus node n1,1 to n3,3. FIG. 9 illustrates twenty-seven voltage waveforms corresponding to the nine power bus nodes times three applied current waveforms. The voltage waveforms of FIG. 9 represent an actual voltage waveform at a particular power bus node of Vdrop=Videal−Vsimulation. In this example, the ground voltage and Vdd voltage for each power bus node was simulated and the difference between Videal and this simulation result was stored. For simplicity the drops in the difference voltage of Vdd—ground are shown in FIG. 9.

Referring again to FIG. 9, note that because aggressor object 705 is near (actually overlapping) node n1,1, the voltage drop due to this aggressor object is largest at this location. However the current needed to supply the demand of object 705 is drawn from the entire power distribution network, and thus a smaller, but non-zero voltage drop occurs even at node n3,3 at the opposite corner of the chip. Similarly, the voltage drop due to aggressor object 710 is largest at node n1,3, and the voltage drop due to aggressor object 715 is largest at node n3,3. Note that no voltage drop is shown at node n3,1 for object 710. While in reality some small drop would occur there, one may choose to ignore any voltage drop waveforms whose maximum amplitude is smaller than some threshold. Note also that although the current waveforms of FIG. 8 were all contained within a single cycle (the cycle end being indicated by the tick mark on the time axis), the voltage drop waveforms of FIG. 9 extend beyond the cycle end. This can occur because the decoupling capacitances which provide some of the charge needed to supply the current demand of an aggressor object continue to recharge after the current waveform has returned to zero. Note also that several of the voltage drop waveforms of FIG. 9 extend both above and below the x axis, meaning that the voltage drop can both lower the voltage at a node below the ideal supply voltage and can also increase it above the ideal supply voltage at different times. This may be due in this example to L*C (inductance times capacitance) resonant effects. The duration of a voltage drop waveform of FIG. 9 will typically be the multiple of the cycle time required to capture all portions of the voltage drop waveform in which the magnitude exceeds some specified threshold. For purpose of this example, a cycle time of 5.0 is used.

Using a block-based statistical timing analysis, the voltage waveforms of FIG. 9 are used to determine timing values for setup and hold tests at flip-flop 750 of FIG. 7. The clock path (also referred to as the capture path) to flip-flop 750 passes through buffers 720 and 725. Two different data paths to flip-flop 750 exist. The first path passes through buffers 720 and 730, flip-flop 745, and logic blocks 755 and 756. The second path passes through buffers 720 and 735, flip-flop 740, and logic blocks 760 and 756. In this example wire delays are ignored for simplicity, so that only the circuit elements of FIG. 7 have delays, and the arrival time at the output of each circuit element is propagated without any additional wire delay to the inputs of the circuit element it feeds. It should be noted that delays can be associated with wires in an integrated circuit design.

For simplicity, this example uses a single common clock cycle time. In other examples, there may be many clocks with different periods. In such cases, the adjusts may be as actual time adjusts rather than integer numbers of cycles, as multiples of a greatest common divisor (GCD) of all clock periods, or a plurality of integer cycle indices for each of a plurality of clock cycles. It should be noted that if the minimum and maximum cycles for which arrival times are required are $C_{min}$ and $C_{max}$, respectively, and the voltage response for a single cycle current waveform simulation lasts for M cycles, the number of different weights (or statistical parameters) required will be $M+(C_{max}-C_{min}-1)$.

Figure 10:
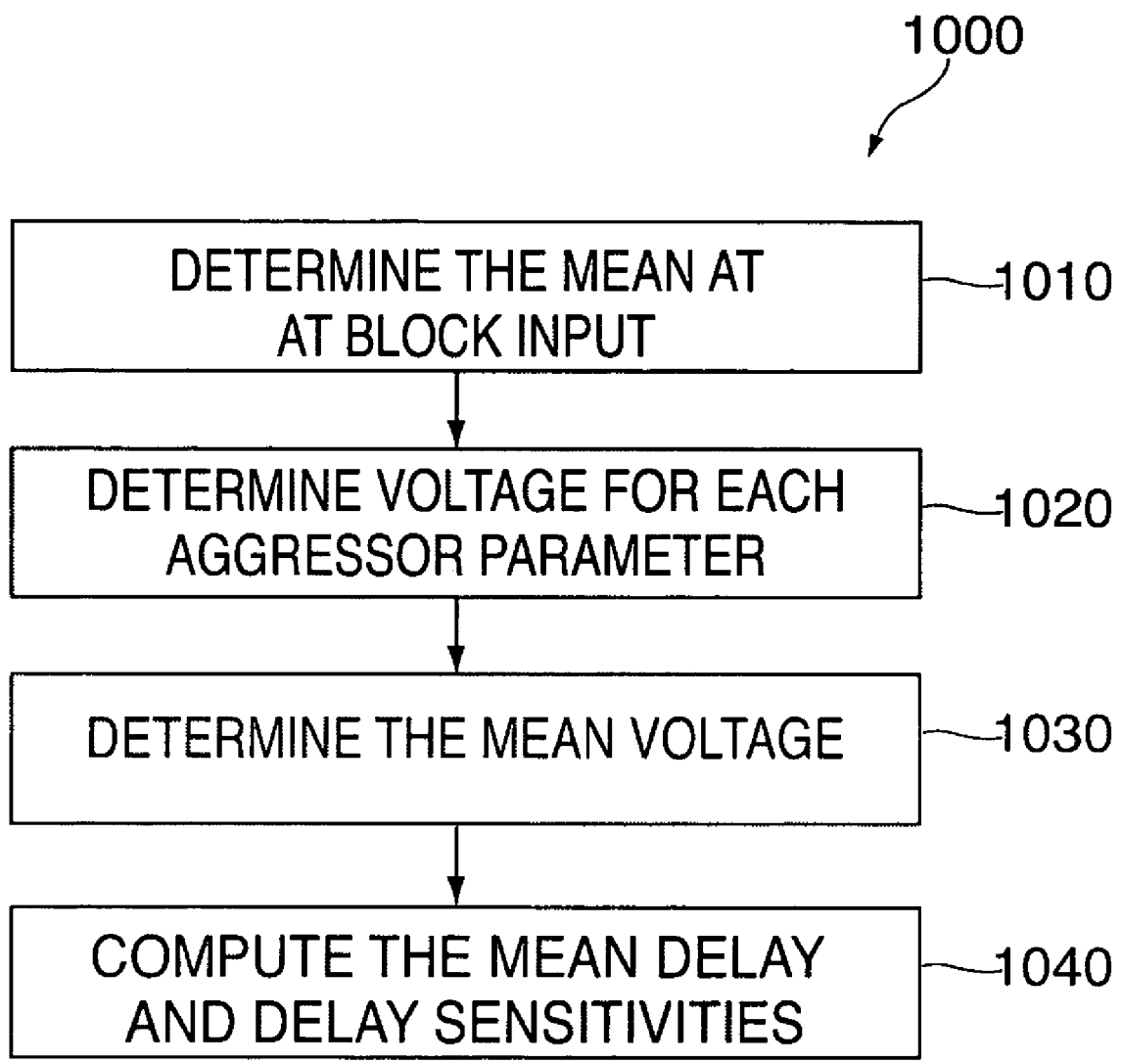
FIG. 10 is a flow diagram of an example step of an example method of the present invention.

Turning now to FIG. 10, an example way 1000 of determining a delay value for a circuit element, such as circuit element 725 of FIG. 7 is illustrated. Although this example determines a delay value for circuit element 725, it should be noted that in performing a timing test on a particular circuit element, such as circuit element 750, a delay for each circuit element in the integrated circuit design may be necessary. In this example, the parameters for the block-based statistical timing analysis are the activities of aggressor objects 705, 710, and 715 in particular cycles. For simplicity the timing tests illustrated for circuit element 750 will be assumed to compare an early and late arrival times from the current cycle. Since the voltage drop waveforms of FIG. 9 have durations of 2 cycles and the timing tests involve arrival times from only the current cycle, the statistical parameters will be the activities of the aggressor objects 705, 710, and 715 in the present cycle (cycle 0) and the previous cycle (cycle 1). Activities from earlier cycles need not be considered in this example, as the voltage drop caused by such activities will have died out by cycle 0. The statistical parameters in this example can be given designations as set forth in Table 1.

TABLE 1

| Parameter | Representing |
|---|---|
| $A_{705(0)}$ | Activity of aggressor object 705 in the present cycle. |
| $A_{705(1)}$ | Activity of aggressor object 705 in the previous cycle. |
| $A_{710(0)}$ | Activity of aggressor object 710 in the present cycle. |
| $A_{710(1)}$ | Activity of aggressor object 710 in the previous cycle. |
| $A_{715(0)}$ | Activity of aggressor object 715 in the present cycle. |
| $A_{715(1)}$ | Activity of aggressor object 715 in the previous cycle. |

Statistical parameter values can be assigned in any range. In this example, statistical parameter values range from +0.5 representing the aggressor object is switching to −0.5 representing the aggressor object is not switching. A statistical parameter value, in this example, of 0 represents average activity of a particular aggressor object when the aggressor object is half-switching. By using this range, several statistical calculations discussed below become easier to handle. If a different range is used, bounds of the parameter value should be adjusted accordingly. For example, if the average activity is desired to represent 30% switching, an aggressor activity parameter may vary from −0.3 to 0.7.

Referring to FIG. 10, at step 1010 a mean arrival time at a circuit element input is determined. In this example, the mean arrival time at the input of circuit element 725 is determined. In determining the mean arrival time, a statistical arrival time can be used. In this example, a statistical arrival time at the input of circuit element 725 can be calculated from the delays of previous circuit elements in a particular path. Here, circuit element 720 occurs prior to circuit element 725 in the path. A delay for circuit element 720 can be determined using method 1000 and, as will be discussed with respect to circuit element 725, can be represented as $\text{delay}_{720} = 2.0 + (0.1)(A_{705(0)}) + (0.3)(A_{705(1)}) + (0.1)(A_{710(0)}) + (-0.2)(A_{710(1)}) + (0.4)(A_{715(0)}) + (-0.3)(A_{755(1)})$. In determining a delay corresponding to a first circuit element in a path, such as circuit element 720, an arrival time at that circuit element can be set to zero or some other asserted value. In this example, the delay corresponding to circuit element 720 is determined using an arrival time at the input of circuit element 720 of zero. Thus, the statistical arrival time at the input of circuit element 725 (ignoring delay due to wire) is $\text{delay}_{720}$.

In this example, half activity is represented by a statistical parameter value of zero because the minimum value for each statistical parameter is −0.5, so that adding 0.5 to this minimum value gives a statistical parameter value of zero. The statistical arrival time at circuit element 725 is $\text{delay}_{720}$, and thus the mean arrival time at 725 when each aggressor object is half switching is determined by setting each of the statistical parameters in $\text{delay}_{720}$ to zero. This gives a mean arrival time value at 725 of 2.0.

At step 1020, a voltage drop value associated with each statistical parameter is determined. In this example, the voltage applied to each circuit element is assumed to be that of the power bus node nearest the particular circuit element. As discussed above, other ways of determining the voltage applied to a particular circuit element can be used, such as computing a weighted value of voltage based on nearby power bus nodes and distances to each from the particular circuit element. In this example, the power bus node closest to circuit element 725 is n3,2. The mean arrival time for a particular circuit element can be used as the specific time in the cycles of a voltage waveform for a power bus node at which to sample a voltage drop value. In this example, the mean arrival time at circuit element 725 is 2.0. The voltage waveforms of FIG. 9 at power bus node n3,2 corresponding to current waveforms of aggressor objects 705, 710, and 715 yield sampled values at time 2.0 for the present cycle and at time 7.0 for the previous cycle as set forth in Table 2. Time 7.0 can be used in this example to represent the previous cycle because the length of a cycle in this example is 5.0 and thus the previous cycle waveform started 5.0 earlier than the current cycle waveform. As a result the current cycle waveform will reach the point 2.0 time units from its start at the same time that the previous cycle waveform reaches the point 7.0 time units from its start.

TABLE 2

| | Voltage Value |
|---|---|
| $V_{\text{drop\_n3,2\_705}}$ at time 2.0 | 0.2 |
| $V_{\text{drop\_n3,2\_705}}$ at time 7.0 | −0.05 |
| $V_{\text{drop\_n3,2\_710}}$ at time 2.0 | 0.1 |
| $V_{\text{drop\_n3,2\_710}}$ at time 7.0 | 0.05 |
| $V_{\text{drop\_n3,2\_715}}$ at time 2.0 | 0.3 |
| $V_{\text{drop\_n3,2\_715}}$ at time 7.0 | −0.1 |

At step 1030 a mean voltage for the delay computation for circuit element 725 is determined. A mean voltage can be obtained by subtracting from the ideal supply voltage (or from the node voltage determined by simulating the power supply network with only the ideal power supply voltage and static current sources applied) the voltage drop caused by each aggressor object at its mean switching activity. Thus, $$V_{mean} = V_{ideal} - \sum_{i=1}^{N} V(i) * \text{statistical parameter for } i$$

In this example, the ideal supply voltage is assumed to be 2.0. One of ordinary skill will recognize that supply voltages may vary. Since the mean switching activity for a particular aggressor object in this example was determined to occur when the aggressor object is half switching and thus the statistical parameter range was set to be from −0.5 to 0.5, the mean voltage drop is obtained by scaling the voltage samples by zero minus the minimum parameter value, or 0.0−(−0.5)=0.5. Thus the mean voltage at circuit element 725 is represented as follows:

$V_{mean} = 2.0 - [(0.2)(0.5) + (-0.05)(0.5) + (0.1)(0.5) + (0.05)(0.5) + (0.3)(0.5) + (-0.1)(0.5)] = 1.75$ At step 1040, a mean delay and sensitivities of the delay to each statistical parameter are determined. In this example, a mean delay, $D_{mean}$, and a sensitivity (or derivative $\delta D/\delta V$) of that delay to voltage may be computed using a precharacterized delay rule, circuit simulation, or other means known to those of ordinary skill. In this example, due to the non-linearity of the delay dependence on voltage, $D_{mean}$, and $\delta D/\delta V$ may be functions of the supply voltage. In this example, Dmean at the mean supply voltage of V=1.75 determined above is equal to 2.0 and $\delta D/\delta V = -1.0$. A $\delta D/\delta V$ value of $-1.0$ represents a delay decreasing by one unit for each unit increase in supply voltage. To compute a delay derivative with respect to each aggressor object statistical parameter, derivative $\delta D/\delta V$ is multiplied by a derivative $\delta V/\delta A_S$, which is a sensitivity of the supply voltage to a switching activity of aggressor object, S. The derivative $\delta V/\delta A_S$ for each aggressor object can be determined from the negative of the voltage drops for each statistical parameter in each cycle (such as the Vdrop values determined in step 1020) divided by (the mean statistical switching parameter value minus the minimum statistical switching parameter value). This relationship can be expressed as follows:

$$\delta V/\delta A_S = -V_{drop}/[A_{maximum} - A_{minimum}]$$

Where, as in this example, the value for $A_{maximum}$ (here 0.5) minus $A_{minimum}$ (here $-0.5$) is equal to 1, the relationship is as follows:

$$\delta V/\delta A_S = -V_{drop}.$$

A sensitivity of a delay to a statistical parameter is determined as follows:

$$\delta D/\delta A_S = \delta D/\delta V * \delta V/\delta A_S.$$

A statistical delay for a particular circuit element can be determined from the mean delay plus the sum of $\delta D/\delta A_S$ multiplied by a corresponding statistical parameter, $A_S$, as follows:

$$D_{stat} = D_{mean} + \Sigma(\delta D/\delta A_S * A_S)$$

This equation can be expressed as follows:

$$D_{stat} = D_{mean} + \Sigma(\delta D/\delta V * \delta V/\delta A_S * A_S)$$

In this example, where $\delta V/\delta A_S = -V_{drop}$ and $\delta D/\delta V = -1.0$, a statistical delay associated with circuit element 725 can be determined from the following:

$$D_{stat\_725} = 2.0 + [(-1.0)(-0.2)(A_{705(0)}) + (-1.0)(0.05)(A_{705(1)}) + (-1.0)(-0.1)(A_{710(0)}) + (-1.0)(-0.05)(A_{710(1)}) + (-1.0)(-0.3)(A_{715(0)}) + (-1.0)(0.1)(A_{715(1)})]$$

Adding a statistical arrival time at the input of a circuit element and the statistical delay associated with the circuit element will determine a statistical arrival time at the output of the circuit element. In this example, the statistical arrival time at the output of circuit element 725 is the statistical arrival time at the input of circuit element 725 (as determined above as the statistical arrival time at the output of circuit element 720) and $D_{stat\_725}$ or $$2.0 + (0.1)(A_{705(0)}) + (0.3)(A_{705(1)}) + (0.1)(A_{710(0)}) + (-0.02)(A_{710(1)}) + (0.4)(A_{715(0)}) + (-0.3)(A_{715(1)}) + 2.0 + [(-1.0)(-0.2)(A_{705(0)}) + (-1.0)(0.05)(A_{705(1)}) + (-1.0)(-0.1)(A_{710(0)}) + (-1.0)(-0.05)(A_{710(1)}) + (-1.0)(-0.3)(A_{715(0)}) + (-1.0)(0.1)(A_{715(1)})] = 4.0 + (0.3)(A_{705(0)}) + (0.25)(A_{705(1)}) + (0.2)(A_{710(0)}) + (-0.15)(A_{710(1)}) + (0.7)(A_{715(0)}) + (-0.4)(A_{715(1)})$$

A statistical maximum (for late mode arrival times) and a statistical minimum (for early mode arrival times) can be determined using methods well known to those of ordinary skill. One example of a method of determining statistical maximum and minimum values in a block-based statistical timing analysis are described in the Visweswariah, et al. paper and U.S. Patent Application Publication No. 2004/0002844 A1 to Jess et al, both of which are incorporated herein by reference. Statistical maximum and minimum values can be used to determine an output arrival time at a particular circuit element having multiple inputs.

This example focuses on the statistical delay and arrival times associated with circuit element 725. In order to perform a timing test, such as a hold and/or a setup test, at circuit element 750, statistical arrival times at each output of each circuit element in each path inputting into circuit element 750 are determined (for simplicity, these calculations are not shown). For each timing test desired, a statistical slack value may be determined. In one example, a slack is defined so that a positive value means that the timing requirement is satisfied and a negative value indicates that the timing requirement is not satisfied. Timing test values can give an indication of how far a particular integrated circuit design is from meeting a timing requirement.

For purposes of simplicity in this example, a statistical hold test slack at circuit element 750 is assumed to be as follows:

$$0.1 + (0.4)(A_{705(0)}) + (0.2)(A_{705(1)}) + (-0.2)(A_{710(0)}) + (-0.1)(A_{710(1)}) + (0.1)(A_{715(0)}) + (0.1)(A_{715(1)}).$$

Also for purposes of simplicity in this example, a statistical setup test slack at circuit element 750 is assumed to be as follows:

$$0.2 + (-0.5)(A_{705(0)}) + (0.2)(A_{705(1)}) + (-0.2)(A_{710(0)}) + (-0.1)(A_{710(1)}) + (-0.4)(A_{715(0)}) + (0.1)(A_{715(1)}).$$

If no restrictions are imposed on the allowable combinations of aggressor object activities, the worst slack value for a test may be obtained by setting all the aggressor object statistical parameters with positive sensitivities to their minimum values and setting all the aggressor object statistical parameters with negative sensitivities to their maximum values. In this example (remembering that a maximum statistical parameter value is +0.5 and a minimum statistical parameter value is −0.5), the worst case statistical hold test slack for circuit element 750 can be represented as follows:

$$0.1 + (0.4)(-0.5) + (0.2)(-0.5) + (-0.2)(0.5) + (-0.1)(0.5) + (0.1)(-0.5) + (0.1)(-0.5) = -0.45.$$

In this example, the worst case statistical setup test slack for circuit element 750 can be represented as follows:

$$0.2 + (-0.5)(0.5) + (0.2)(-0.5) + (-0.2)(0.5) + (-0.1)(0.5) + (-0.4)(0.5) + (0.1)(-0.5) = -0.55.$$

Figure 11:
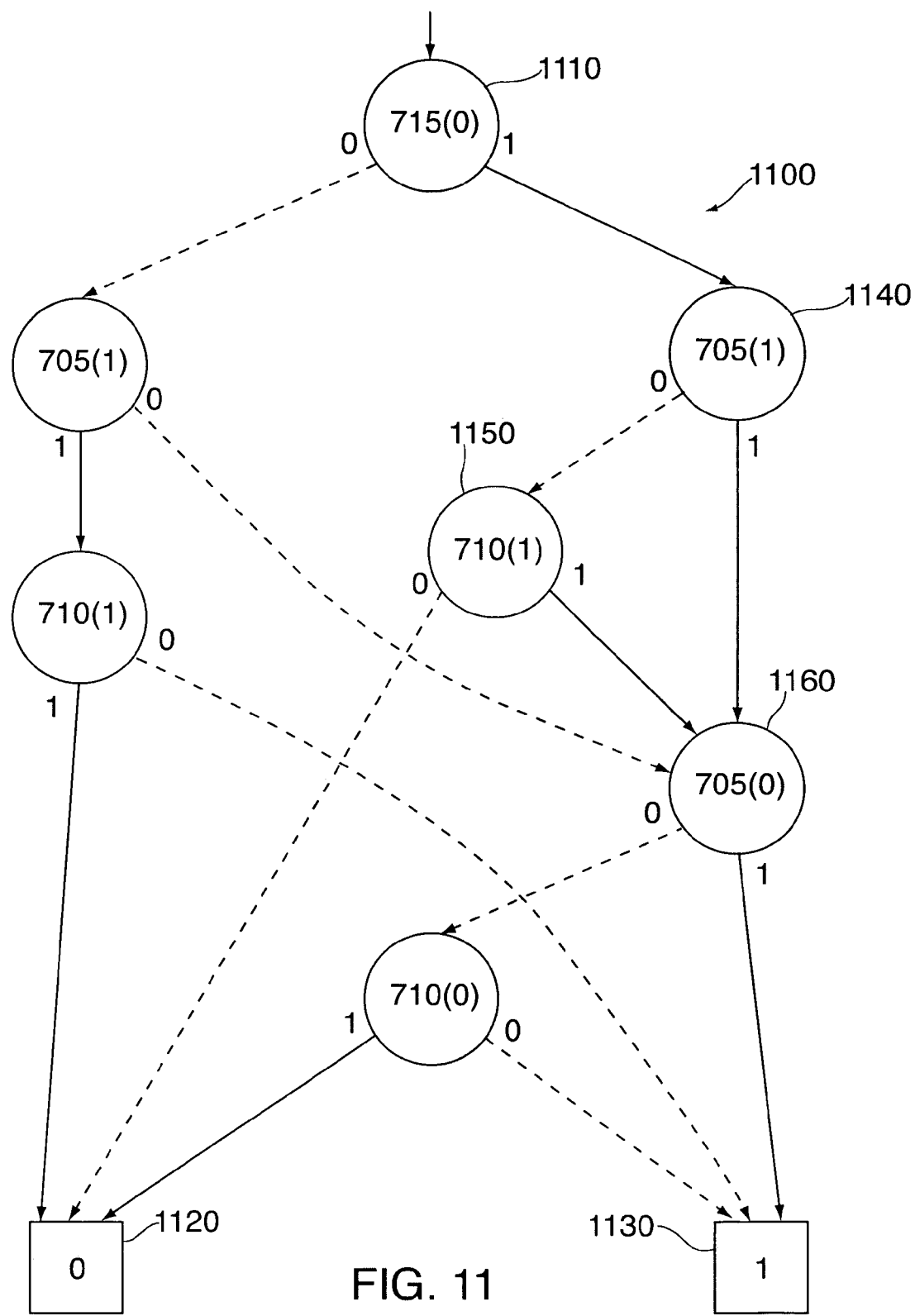
FIG. 11 is an example of a BDD.

If particular combinations of aggressor object switching activities may not occur in the same cycle, a logical expression can be used to improve the quality of the timing values determined. One example of a representation of a logical expression that can be used to express allowable switching combinations is a BDD. Assume now for this example, that aggressor objects 705 and 710 cannot switch in the same cycle. This gives logical conditions NOT ($A'_{705(0)}$ AND $A'_{710(0)}$) and NOT ($A'_{705(1)}$ AND $A'_{710(1)}$), each of which must be satisfied. Note that the A' designator is used in this BDD example to represent Boolean variables for each aggressor object switching parameter. A Boolean variable A's for aggressor object S in a particular cycle with a value of 1, or a TRUE value, represents aggressor object S switching in that cycle, and corresponds to the related statistical parameter $A_S$ being at its maximum value (0.5 in the present example). Boolean variable $A'_S$ with a value of 0, or a FALSE value, represents aggressor object S not switching in that cycle, and corresponds to the related statistical parameter $A_S$ being at its minimum value (−0.5 in the present example). As another constraint on the switching activity in this example, it is assumed now that aggressor object 715 can only switch in a cycle following a cycle in which either aggressor object 705 or 710 have switched. This leads to a logical condition NOT A'$_{715(0)}$ OR A'$_{705(1)}$ OR A'$_{710(1)}$, which must also be satisfied. By taking the logical AND of all of these logical conditions a composite condition can be obtained which must be satisfied. From the composite condition, well known methods can be used to construct a BDD. An example BDD is illustrated in FIG. 11 corresponding to the composite logical condition NOT (A'$_{705(0)}$ AND A'$_{710(0)}$) AND NOT (A'$_{705(1)}$ AND A'$_{710(1)}$) AND (NOT A'$_{715(0)}$ OR A'$_{705(1)}$ OR A'$_{710(1)}$). In this particular example, a reduced, ordered BDD (ROBDD) is used.

One property of an ROBDD is that the expression node variables are ordered, so that a variable visited along any path from a root 1110 of a BDD to its leaves 1120 and 1130 always appears in the same order, although some variables may be skipped along particular paths. Note that although the term node is used for both BDD expression variable nodes, or BDD nodes, and power bus nodes, the two are unrelated. In the BDD illustrated in FIG. 11, the leaf 1120 represents a 0 expression node and the leaf 1130 represents a 1 expression node. A position in which a variable appears in the root to leaves ordering is called its level. One of ordinary skill will recognize how to select a variable ordering so to reduce a BDD size. Reducing a BDD size may be computationally expensive, however, reducing a BDD size can be advantageous in that only a single BDD is needed in a method of the present invention to express allowed combinations of switching activity. A traversal of a BDD in which the run time is linear in its size can be performed for each timing test of a particular circuit element. A reduced size of a BDD will reduce the time required to process successive traversals of the BDD. In one example of ordering BDD variables, variables representing aggressor objects that are not restricted in their switching are included in the ordering scheme of the BDD, even if a corresponding variable does not appear in the BDD. In the present BDD example, a variable ordering can be A'$_{715(0)}$, A'$_{715(1)}$, A'$_{705(0)}$, A'$_{710(0)}$, A'$_{705(1)}$, A'$_{710(1)}$. Note that in figures illustrating a BDD, expression node variables are represented by the corresponding aggressor object indicator and cycle indicator. For example, expression node variable A'715(0) is represented as 715(0) in FIG. 11.

Using a logical expression, such as the BDD example, and the voltage waveforms determined above, an extreme timing value can be determined. Referring to FIG. 11, a BDD 1100 for the present example is illustrated. In this example, a partial slack value is determined for each BDD expression variable node as a function of that expression variable node's children expression variable nodes. Each expression variable node, such as the node 1140 representing A'705(1), has a 0 edge and a 1 edge, each of which point to a child expression variable node, such as 1150 and 1160 for node 1140. In this example, a depth-first search of BDD 1100 is performed, where a partial slack value for a given expression variable node is calculated after such a value for children expression variable nodes is determined. The partial slack value for each expression variable node is stored for later use and to avoid recalculation.

In this example, a partial slack ps(n) for a particular BDD expression variable node, n, is computed as follows:

$$ps(n) = \min\left\{sv0(v(L(n))) + ps(n(0)) \sum_{i=L(n)+1}^{L(n(0))-1} \min(sv0(v(i)), sv1(v(i))),\right.$$

-continued $$\left. sv1(v(L(n))) + ps(n(1)) + \sum_{i=L(n)+1}^{L(n(1))-1} \min(sv0(v(i)), sv1(v(i)))\right\}$$

where ps(n(0)) and ps(n(1)) are the partial slacks of the zero and one children of n, respectively, L(n) is the level of n, L(n(0)) and L(n(1)) are the levels of the zero and one children of n, respectively, v(L(n)) is the Boolean variable for n (and all nodes at the same level), and sv0(v) and sv1(v) are the slack variation occurring when Boolean variable v is zero or one, respectively. If the slack is linearly dependent on v with slope k, and the nominal slack is computed with v having a value of 0.5 (as in this example), we would have sv0(v)=−k/2 and sv1(v)=+k/2. These sv0(v) and sv1(v) values can be derived from the block-based statistical timing analysis. The partial slack of leaf node 0 (1120) is +infinity, because any path to this node represents a disallowable combination of switching activities, and thus the timing margin is effectively infinite. The partial slack for leaf node 1 (1130) is simply the average slack for the node. The partial slack of the root node is then the worst slack that can occur under an allowable combination of switching activity.

Figure 12:
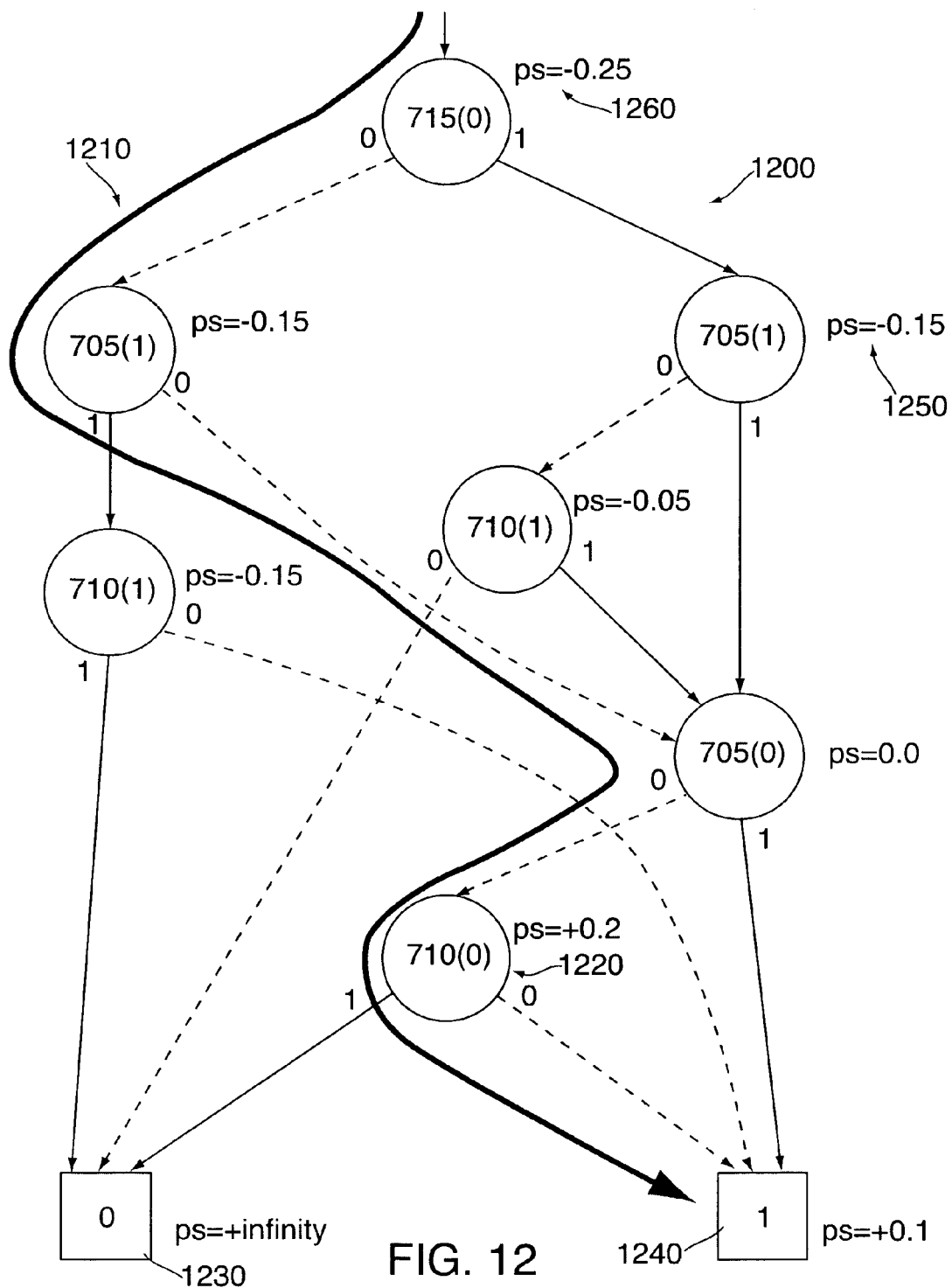
FIG. 12 is an example of a BDD showing example partial slack values for a hold test.
Figure 13:
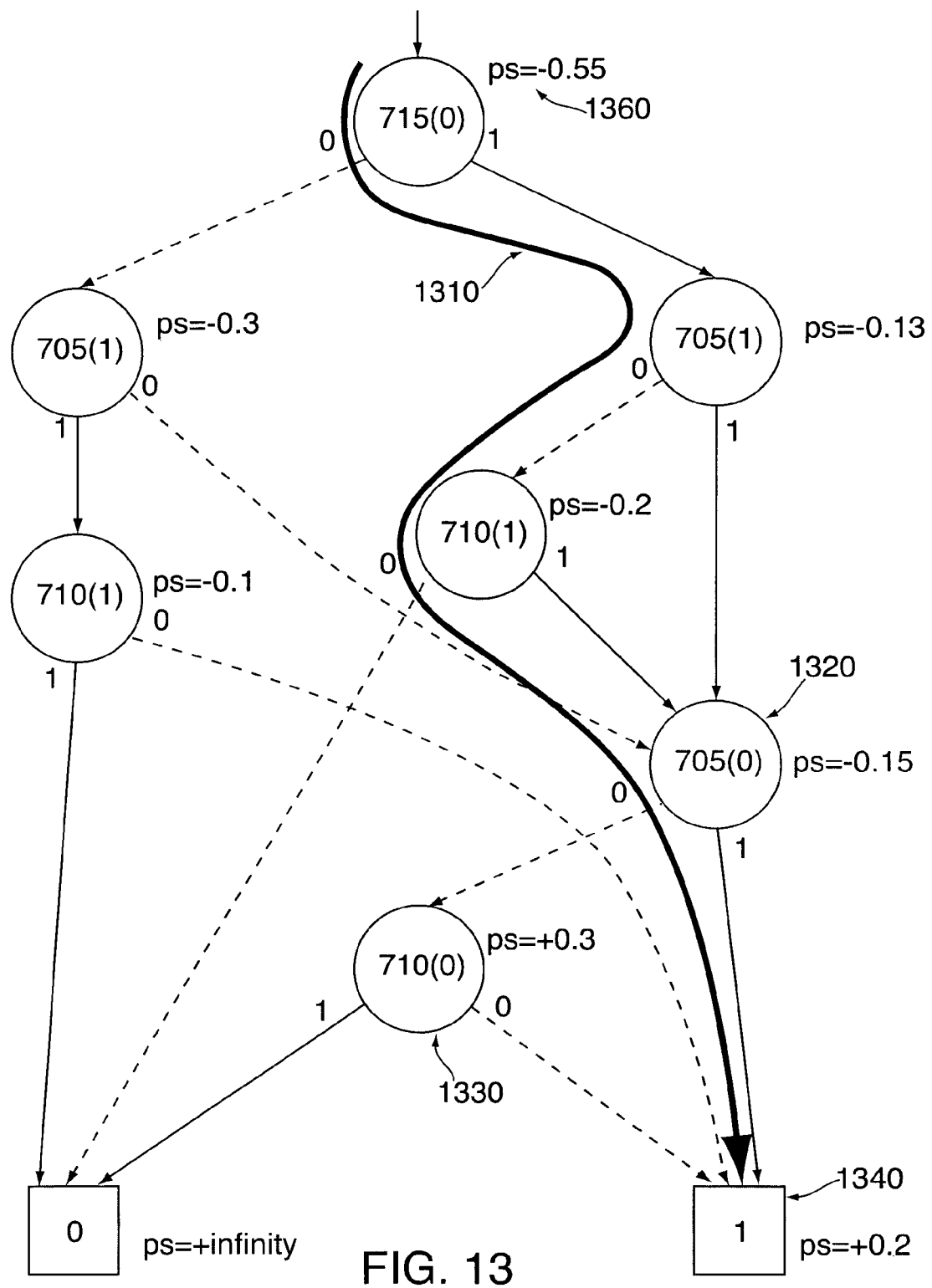
FIG. 13 is an example of a BDD showing example partial slack values for a slack test.

The partial slack values for expression variable nodes of the BDD of FIG. 11 for the statistical hold test assumed for circuit element 750 are shown in FIG. 12, and the partial slack values for expression variable nodes of the BDD of FIG. 10 for the statistical setup test assumed for circuit element 750 are shown in FIG. 13. These partial slack values for each expression variable node are computed using the above formula where the slack variations for the hold test (obtained from the statistical hold slack given above) are:

sv0(705(1))=−0.1 sv1(705(1))=+0.1 sv0(705(0))=−0.2 sv1(705(0))=+0.2 sv0(710(1))=+0.05 sv1(710(1))=−0.05 sv0(710(0))=+0.1 sv1(710(0))=−0.1 sv0(715(1))=−0.05 sv1(715(1))=+0.05 sv0(715(0))=−0.05 sv1(715(0))=+0.05 and the slack variations for the setup test (obtained from the statistical setup slack given above) are:

sv0(705(1))=−0.1 sv1(705(1))=+0.1 sv0(705(0))=+0.25 sv1(705(0))=−0.25 sv0(710(1))=+0.05 sv1(710(1))=−0.05 sv0(710(0))=+0.1 sv1(710(0))=−0.1 sv0(715(1))=−0.05 sv1(715(1))=+0.05 sv0(715(0))=+0.2 sv1(715(0))=−0.2

Referring again to FIG. 12, the minimum hold slack 1260 of −0.25 occurs for aggressor switching Boolean variable assignments of A'$_{705(0)}$=0, A'$_{705(1)}$=0, A'$_{710(0)}$=0, A'$_{710}$(1)=1, A'$_{715(0)}$=0, A'$_{715(1)}$=0, corresponding to path 1210 through the BDD. In all examples based on the BDD of FIG. 11, the variable level ordering is 1(715(0))=1, 1(715(1))=2, 1(705(1))=3, 1(710(1))=4, 1(705(0))=5, and 1(710(0))=6. The terminal nodes 1 and zero have a level one greater than the maximum variable level number, thus in this case their levels are both 7.

In FIG. 12 the partial slack value of node 1220 is computed as follows. The variable of node 1220 is A'$_{710(0)}$ or for simplicity it can be represented here as 710(0), and its level is 6. Its zero child, n(0), is node 1240, the 1 terminal node, whose partial slack is +0.1. Its one child, n(1), is node 1230, the 0 terminal node, whose partial slack is +infinity. The slack variation sv0(710(0)) when 710(0) is 0 is +0.1 and the slack variation sv1(710(0)) when it is 1 is −0.1. The level numbers of these child nodes are 7. Since the level number of 1230 and 1240 are only one greater than the level number of 1220, the sums within the partial slack formula will be taken over an empty range (i.e., from 7 to 6). Thus the formula for partial slack gives:

$$ps(1220) = \text{minimum} (+0.1++0.1, -0.1++\text{infinity}) = +0.2$$

Referring now to FIG. 13, the minimum setup slack 1360 of −0.55 occurs for aggressor switching Boolean variable assignments of A'$_{705(0)}$=1, A'$_{705(1)}$=0, A'$_{710(0)}$=1, A'$_{710(1)}$=1, A'$_{715(0)}$=1, A'715(1)=0, corresponding to path 1310 through the BDD.

In FIG. 13 the partial slack value of node 1320 is computed as follows. The variable of the node is A'705(0), or for simplicity it can be represented here as 705(0), and its level is 5. Its zero child, n(0), is node 1330, whose partial slack is +0.3 and whose level is 6. Its one child, n(1), is node 1340, the 1 terminal node, whose partial slack is +0.2 and whose level is 7. The slack variation sv0(705(0)) when 705(0) is 0 is +0.25 and the slack variation sv1(705(0)) when it is 1 is −0.25. Since the level number of 1330 is only one greater than the level number of 1320, the first sum within the partial slack formula will be taken over an empty range (i.e., from 6 to 5). However since the level number of 1340 is 2 greater than the level number of 1320, the second sum in the partial slack formula will be taken over the non-empty range from 6 to 6. The only level in this range is 6, corresponding to variable 710(0). This sum includes all variables in the ROBDD variable ordering which were skipped by the one child of node 1320. The slack variation sv0(710(0)) when 710(0) is 0 is +0.1 and the slack variation sv1(710(0)) when it is 1 is −0.1. Thus the formula for partial slack gives:

$$ps(1220) = \text{minimum} (+0.25+(+0.3), -0.25+(+0.2)+\text{minimum}(-0.1, +0.1)) = -0.15$$

Thus the worst possible hold slack is improved to −0.25 (from −0.45 without restrictions on aggressor switching combinations), while the worst possible setup slack remains unchanged at −0.55.

EXAMPLE TWO

In this example, an extreme value of a voltage drop at a particular power bus node is determined. Referring again to FIG. 7, this example will use the same integrated circuit design 700 that was used in the previous example. In determining an extreme value of a voltage drop for a power bus node of an integrated circuit design, such as integrated circuit design 700, voltage waveforms corresponding to a particular power bus node and each aggressor object are determined as discussed above. For this example, the $V_{drop}$ values for power bus node n3,2 that are set forth in Table 2 will be used to determine a maximum and a minimum voltage drop value for power bus node n3,2.

In this example, a cycle period of 5.0 is used. Intervals are set in each of the voltage waveforms of FIG. 9 corresponding to node n3,2 at 0.0, 1.0, 2.0, 3.0, and 4.0. Note that an offset of 5.0 will bring the analysis to the beginning of the next cycle, and is therefore unneeded since an analysis using an offset of 0.0 will have already provided the extreme voltages at the beginning of the cycle. As previously determined, $V_{drop}$ values at interval 2.0 are set forth in Table 2. Although extreme voltage drop values are determined only at intervals within a single (current) cycle, switching activity of aggressor objects in previous cycles may still influence the voltage drop in the current cycle. Thus, as in the case of determination of extreme slack values, the determination of extreme voltage values must consider samples from the voltage waveforms representing aggressor object activity in both the current and earlier cycles. Voltage samples for a waveform representing aggressor activity k cycles before the current cycle used to determine extreme voltages for an interval at time t are taken at time t+kT in the aggressor object voltage waveform. Thus, for the present example cycle 0 (present cycle) samples for time interval 2.0 are taken at 2.0 (=2.0+0.0*5.0) and cycle 1 (previous cycle) samples for time interval 2.0 are taken at 7.0 (=2.0+1.0*5.0). In the absence of logical constraints on combinations of switching activities, maximum and minimum $V_{drop}$ values are determined by taking the sums of the positive voltage drop samples and the sums of the negative voltage drop samples, respectively. Since the voltage drop due to an aggressor object in a particular cycle is zero when that object is not switching in that cycle, these sums of positive and negative voltage drop values can be seen to be the sums of the maximum and minimum voltage drops, respectively, that occur due to various degrees of switching of the aggressor objects.

The $V_{drop}$ samples values for node n3,2 previously given in Table 2 are set forth again in Table 3, with the maximum and minimum $V_{drop}$ values for the node. Similar analyses would be done at the other time intervals shown in the table. The maximum value among the interval maximum values and the minimum value among the interval minimum values would also be determined, and these would be reported as the extreme values of voltage drop which could occur on node 3,2. A dash (−) is entered in the table for the maximum and minimum values of the individual voltage drops, because while these could easily be computed, they are not typically useful. The maximum voltage drop of 0.65 on node n3,2 in interval 2.0 occurs when 705, 710, and 715 switch in the current cycle and 710 switches in the previous cycle. The minimum voltage drop of 0.65 on node n3,2 in interval 2.0 occurs when no objects switch the current cycle and 705 and 715 switch in the previous cycle.

TABLE 3

|  | 0.0 | 1.0 | 2.0 | 3.0 | 4.0 | Extreme Value |
|---|---|---|---|---|---|---|
| $V_{drop\ n3,2\ 705}$ cycle0 |  |  | 0.2 |  |  | – |
| $V_{drop\ n3,2\ 710}$ cycle0 |  |  | 0.1 |  |  | – |
| $V_{drop\ n3,2\ 715}$ cycle0 |  |  | 0.3 |  |  | – |
| $V_{drop\ n3,2\ 705}$ cycle1 |  |  | −0.05 |  |  | – |
| $V_{drop\ n3,2\ 710}$ cycle1 |  |  | 0.05 |  |  | – |
| $V_{drop\ n3,2\ 715}$ cycle1 |  |  | −0.1 |  |  | – |
| Maximum |  |  |  |  |  | 0.65 |
| Minimum |  |  |  |  |  | −0.15 |

In this example, if particular combinations of aggressor object switching activities may not occur in the same cycle, a logical expression can be used to improve the quality of the extreme voltage values determined. One example of a representation of a logical expression that can be used in this example is the same BDD determined previously in FIG. 11 to represent the allowable combinations of aggressor switching activities. A partial voltage drop for each BDD expression variable node as a function of its child nodes (the nodes to which its 0 and 1 edges point) is determined. This can be done efficiently using a depth-first search of the BDD tree, where the partial voltage drop for a BDD node is computed after those of its children have been computed. For efficiency, once a partial voltage drop value has been computed for a BDD node it is stored on the node for the duration of the analysis of the particular voltage determinations. Thus each BDD node partial voltage drop must be computed only once, and the procedure run time is linear in the size of the BDD. The partial voltage drop pvd(n) for a particular BDD node n is computed as follows, where pvd(n(0)) and pvd(n(1) are the partial voltage drops of the zero and one children of n, respectively, L(n) is the level of n, L(n(0)) and L(n(1)) are the levels of the zero and one children of n, respectively, v(L(n)) is the statistical parameter variable for n (and all nodes at the same level), and vdv(v) is the voltage drop variation occurring when Boolean variable v is zero (the voltage drop occurring when the variable is zero will simply be 0.0).

When finding the maximum voltage drop the partial voltage drop of leaf node 0 is negative infinity (−infinity), and when finding the minimum voltage drop the partial voltage drop of leaf node 0 is positive infinity (+infinity). The partial voltage drop for leaf node 1 is 0.0 in both cases. The maximum partial voltage drop pvd+(n) for a node n is:

$$pvd+(n) = \text{maximum}\left\{pvd+(n(0)) + \sum_{i=L(n)+1}^{L(n(0))-1} \text{of maximum}(0, vdv(v(i))), \right.$$

$$\left. vdv(v(L(n))) + pvd+(n(1)) + \sum_{i=L(n)+1}^{L(n(1))-1} \text{of maximum}(0, vdv(v(i)))\right\}$$

and the minimum partial voltage drop pvd−(n) for node n is:

$$pvd-(n) = \text{minimum}\left\{pvd-(n(0)) + \sum_{i=L(n)+1}^{L(n(0))-1} \text{of minimum}(0, vdv(v(i))), \right.$$

$$\left. vdv(v(L(n))) + pvd-(n(1)) + \sum_{i=L(n)+1}^{L(n(1))-1} \text{of minimum}(0, vdv(v(i)))\right\}$$

The maximum and minimum partial voltage drops pvd+(root) and pvd−(root) of the BDD root node are the extreme voltage values that can occur on the power bus node under any allowable combination of switching activity.

Figure 14:
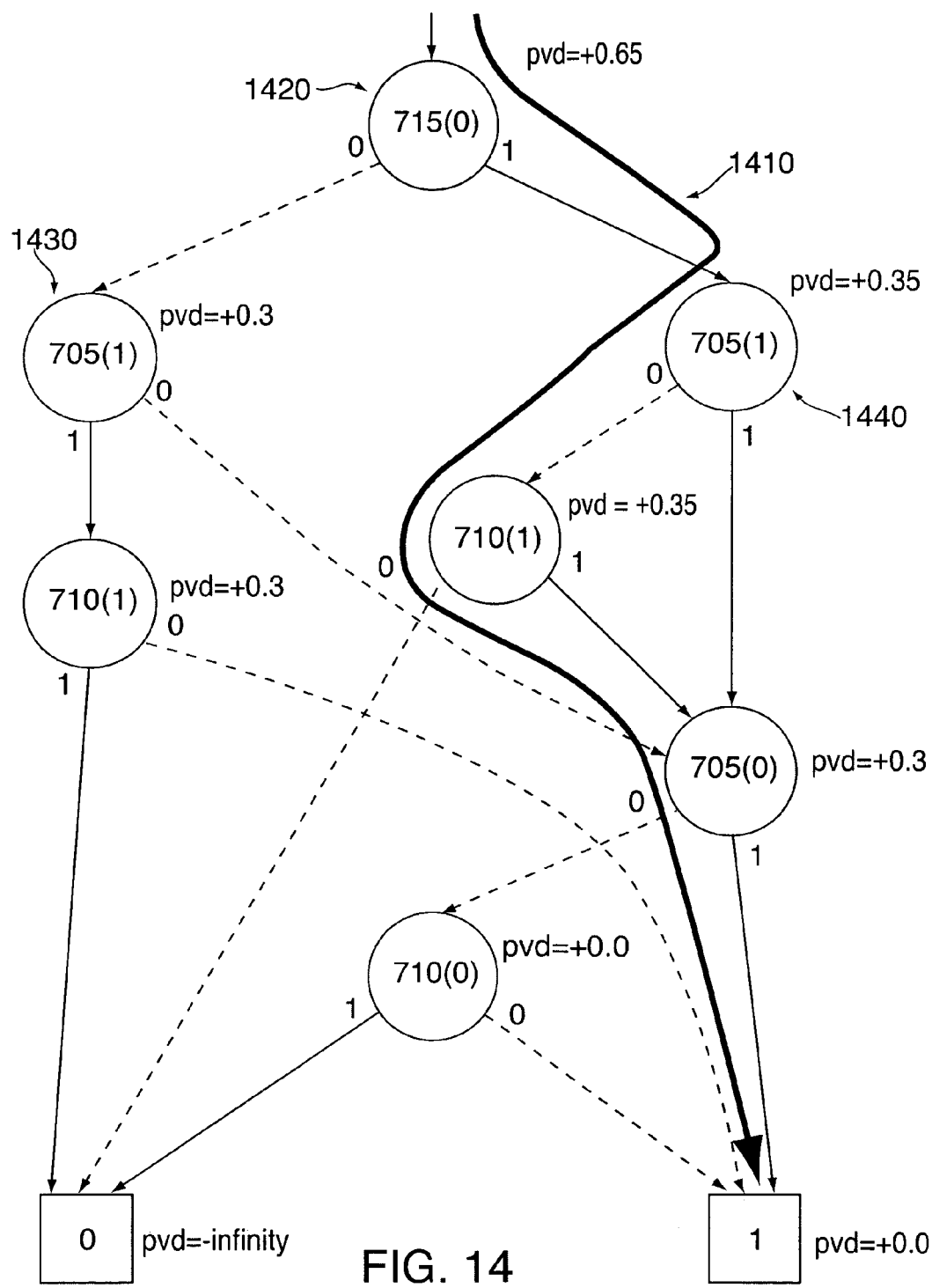
FIG. 14 is an example of a BDD showing example partial voltage values.
Figure 15:
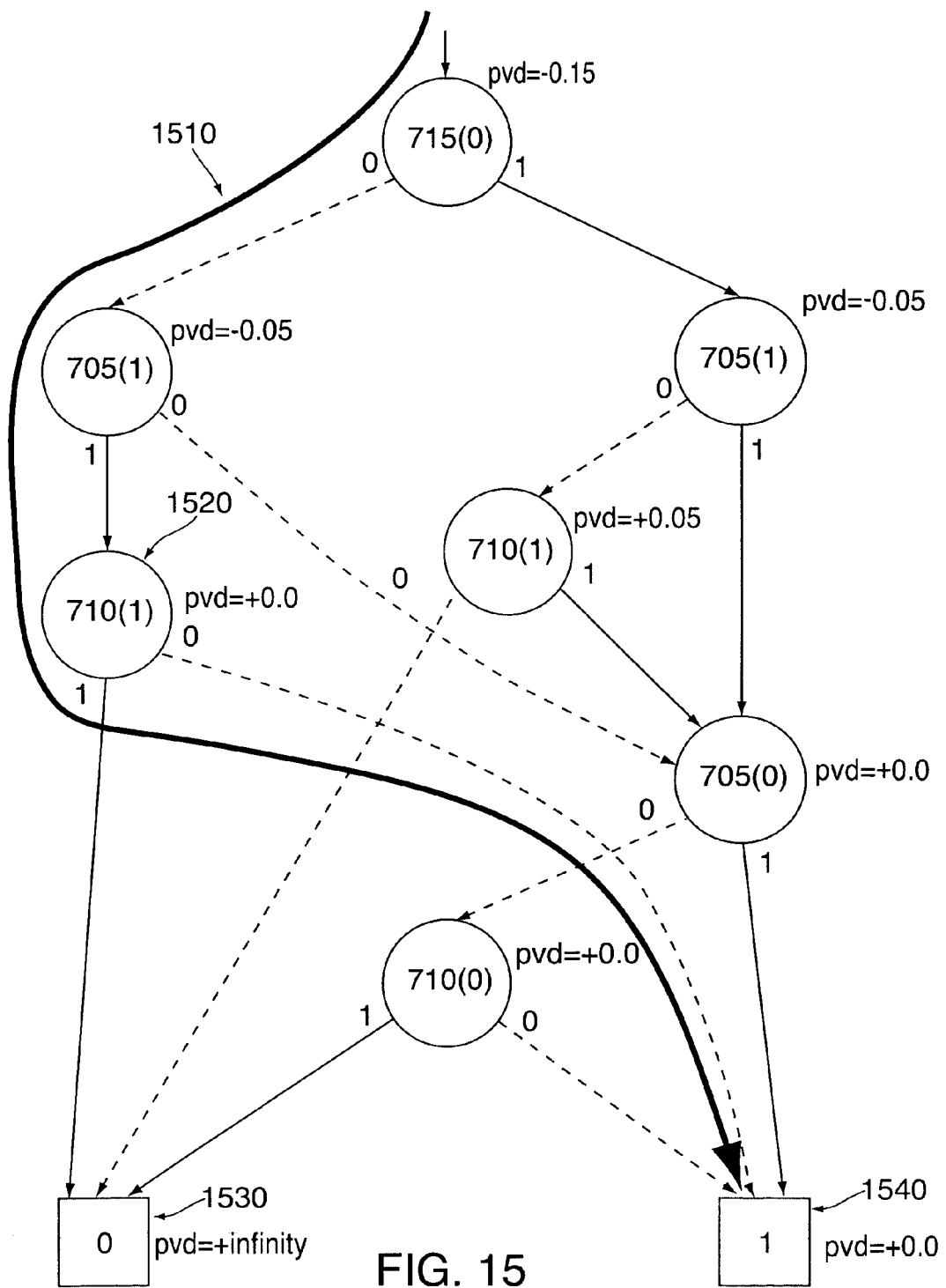
FIG. 15 is an example of a BDD showing example partial voltage values.

FIG. 14 illustrates a BDD used to determine a maximum voltage drop and FIG. 15 illustrates a BDD used to determine a minimum voltage drop, each for power bus node n3,2 at time offset 2.0 within the clock cycle. It should be noted that a different assignment of vdv(v(i)) values to BDD variables is used for each time interval. This example for simplicity illustrates only the computation of the minimum and maximum values of node n3,2 at time interval 2.0. The previously given voltage drops for node n3,2 at this offset are:

vdrop_n3,2(705) at 2.0=0.2 vdrop_n3,2(705) at 7.0=−0.05 vdrop_n3,2(710) at 2.0=0.1 vdrop_n3,2(710) at 7.0=0.05 vdrop_n3,2(715) at 2.0=0.3 vdrop_n3,2(715) at 7.0=−0.1

Note that the values at time 2.0 give the value of the voltage drop due to the specified aggressor switching in the current cycle, and the values given at time 7.0 represent the voltage drop due to the specified aggressor switching in the previous cycle (i.e., at time 2.0+T, where T is the clock period, in this case assumed to be 5.0).

Referring to FIG. 14, the maximum partial voltage drop of BDD node 1420 is computed as follows. The variable of the BDD node is 715(0), and its level is 1. Its zero child, n(0), is node 1430, with variable 705(1), maximum partial voltage drop +0.3, and level 3. Its one child, n(1), is node 1440, with variable 705(1), maximum partial voltage drop +0.35, and level 3. The voltage drop variation vdv(715(0)) when 715(0) is 1 is +0.3, which is simply the voltage drop at node n3,2 at time 2.0 due to switching of 715(0). In the maximum partial voltage drop formula the variation is zero when the variable is zero, i.e., when an aggressor is not switching it causes no voltage drop. Since the level number of 1430 is 2 greater than the level number of 1420, the first sum in the maximum partial voltage drop formula will be taken over the non-empty range from 2 to 2. The only level in this range is 2, corresponding to variable 715(1). This sum includes all variables in the ROBDD variable ordering which were skipped by the zero child of node 1420. Similarly, because the level number of one child 1440 is two greater than that of 1420, the second sum of the maximum partial voltage drop formula will also have only one term, for variable 715(1). The voltage drop variation vdv(715(1)) when 715(1) is 1 is −0.1. Thus the formula for maximum partial voltage drop gives:

pvd+(1420)=maximum (+0.3+maximum (0, −0.1), +0.3+0.35+maximum (0, −0.1))=0.65

Thus the maximum voltage drops at power bus node n3,2 at time offset 2.0 within the clock cycle is +0.65, which occurs with aggressor switching Boolean variable assignments of 705(1)=0, 705(0)=1, 710(1)=1, 710(0)=1, 715(1) =0, 715(0)=1, corresponding to path 1400 through the BDD.

Referring to FIG. 15, the minimum partial voltage drop of BDD node 1520 is computed as follows. The variable of the node is 710(0), and its level is 4. Its zero child, n(0), is the BDD node 1530, the terminal 0 node, with minimum partial voltage drop +infinity and level 7. Its one child, n(1), is BDD node 1540, the terminal 1 node, with minimum partial voltage drop +0.0 and level 7. The voltage drop variation vdv(710(0)) when 710(0) is 1 is +0.05, which is simply the voltage drop at node n3,2 at time 7.0 (the sample time of 2.0 plus the cycle time of 5.0) due to switching of 710(0). In the minimum partial voltage drop formula the variation is zero when the variable is zero, i.e., when an aggressor is not switching it causes no voltage drop. Since the level numbers of both 1530 and 1540 are 3 greater than the level number of 1520, both sums in the minimum partial voltage drop formula will be taken over the non-empty range from 5 to 6. The levels in this range corresponds to variables 705(0) and 710(0). This sum includes all variables in the ROBDD variable ordering which were skipped by the zero and one children of node 1520. The voltage drop variation vdv(705(0)) when 705(0) is 1 is +0.2, and the voltage drop variation vdv(710(0)) when 710(0) is 1 is +0.1. Thus the formula for minimum partial voltage drop gives:

$$pvd-(1520)=\min(0.0+\min(0.0,+0.1)+\min(0.0,+0.2),\\+0.05+\text{infinity}+\min(0.0,+0.1)+\min(0.0,+0.2))\\=0.0$$

The minimum voltage drops at node n3,2 at time offset 2.0 within the clock cycle is −0.15, which occurs with aggressor switching Boolean variable assignments of 705(1)=1, 705(0)=0, 710(1)=0, 710(0)=0, 715(1)=1, 715(0)=0, corresponding to path 1500 through the BDD. Thus, in this example the logical expression does not result in any reduction in the maximum voltage drop or and increase in the minimum voltage drop, although in many cases it may do so.

Figure 16:
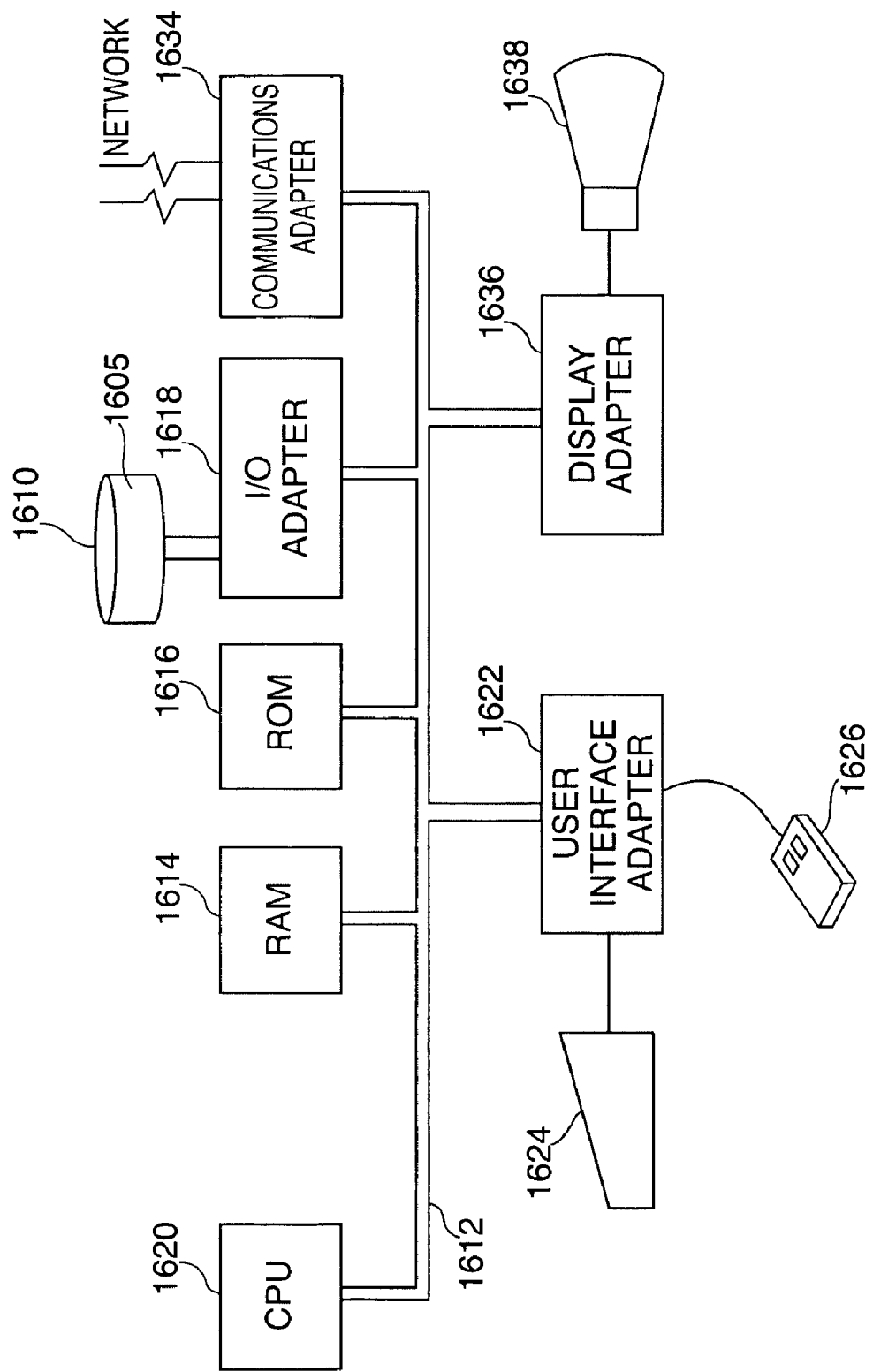
FIG. 16 is an exemplary computing environment in which the present invention may be implemented.

Referring to FIG. 16, an exemplary computing environment 1600 is illustrated. In one embodiment, a method of the present invention can be implemented in a system including computer-executable instructions, typically included in program modules, that are executed by a conventional, general purpose computing device. Examples of conventional, general purpose computing devices include, but are not limited to, a personal computer; a handheld device, such as a personal data assistant (PDA) and a mobile telephone device; a server; and any combinations thereof. In one example of this embodiment, system 1605 resides in memory system 1610, such as a disk unit or tape unit. Central processing unit (CPU) 1620 is interconnected via a system bus 1612 to a random access memory (RAM) 1614, read-only memory (ROM) 1616, input/output (I/O) adapter 1618 (for bus 1612), user interface adapter 1622 (for connecting a keyboard 1624, mouse 1626, and/or other user interface device to bus 1612), communication adapter 1634 (for connection to an external network, such as a LAN, WAN, Internet, and/or WLAN), and display adapter 1636 (for connecting bus 1612 to a display device 1638).

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. A method of determining an extreme value of a voltage dependent parameter of an integrated circuit design, the integrated circuit design having a plurality of power bus nodes, the method comprising:
   (a) determining a plurality of current waveforms, each of said plurality of waveforms corresponding to one of a plurality of aggressor objects in the design of the integrated circuit;
   (b) applying each of said plurality of current waveforms to a subset of the plurality of power bus nodes, said subset of the plurality of power bus nodes being designed to supply power to a corresponding one of said plurality of aggressor objects;
   (c) determining a plurality of voltage waveforms, each of said plurality of voltage waveforms being at one of said plurality of power bus nodes and corresponding to one of said plurality of current waveforms;
   (d) determining a logical expression to specify at least one subset of said plurality of current waveforms that can occur together; and
   (e) using said plurality of voltage waveforms and said logical expression to determine the extreme value.

2. A method according to claim 1, wherein said logical expression comprises a binary decision diagram.

3. A method according to claim 2, wherein said binary decision diagram comprises a plurality of binary decision nodes and wherein said using step (e) further comprises:
   (a) computing for each binary decision node a partial extreme value;
   (b) using said partial extreme values to determine the extreme value.

4. A method according to claim 1, wherein said extreme value is a static timing analysis value.

5. A method according to claim 4, wherein said using step (e) comprises determining a delay for at least one delay arc using one or more of said plurality of voltage waveforms and a block-based statistical timing analysis, said block-based statistical timing analysis having a plurality of statistical parameters, each of said plurality of statistical parameters representing an activity of one of said plurality of aggressor objects.

6. A method according to claim 5, wherein said using step (e) further comprises:
   i. determining a plurality of slack variation values, each of said plurality of slack variation values corresponding to one of said plurality of statistical parameters;
   ii. using said plurality of slack variation values and said logical function to determine a worst case slack of at least one timing test using.

7. A method according to claim 1, wherein said extreme value is a voltage extreme at a selected one of said plurality of power bus nodes.

8. A method according to claim 7, wherein said using step (e) comprises:
   i. determining a subset of said plurality of voltage waveforms corresponding to said selected one of said plurality of power bus nodes, each of said subset of said plurality of voltage waveforms having one or more clock cycles;
   ii. determining a plurality of voltage values, each of said plurality of voltage values being at one of a plurality of intervals of said one or more clock cycles; and
   iii. determining an extreme voltage value for said selected one of said plurality of power bus nodes from said plurality of voltage values.

9. A method according to claim 1, wherein at least one of said plurality of voltage waveforms has a duration of more than one clock cycle, and wherein said logical expression accounts for a subset of said more than one clock cycle in which each of said current waveforms can occur.

10. A method according to claim 1, further comprising modifying the integrated circuit design such that a previously allowed subset of said plurality of current waveforms can no longer occur together.

11. A method of determining voltage extremes at a power bus node of an integrated circuit design, the integrated circuit design having a plurality of power bus nodes, the method comprising:
(a) determining a plurality of current waveforms, each of said plurality of waveforms corresponding to one of a plurality of aggressor objects in the design of the integrated circuit;
(b) applying each of said plurality of current waveforms to a subset of the plurality of power bus nodes, said subset of the plurality of power bus nodes being designed to supply power to a corresponding one of said plurality of aggressor objects;
(c) determining a plurality of voltage waveforms at a selected one of said plurality of power bus nodes for each said plurality of current waveforms applied, each of said plurality of voltage waveforms having one or more clock cycles; and
(d) using said plurality of voltage waveforms to determine an extreme voltage value for said selected one of said plurality of power bus nodes.

12. A method according to claim 11, wherein said using step (d) comprises:
i. determining a plurality of voltage values, each of said plurality of voltage values being at one of a plurality of intervals of said one or more clock cycles; and
ii. determining an extreme voltage value for said selected one of said plurality of power bus nodes from said plurality of voltage values.

13. A method according to claim 12, further comprising determining a logical expression to specify at least one subset of said plurality of current waveforms that occur together.

14. A method according to claim 13, wherein said logical expression comprises a binary decision diagram.

15. A computer readable medium containing computer executable instructions implementing a method of determining an extreme value of a voltage dependent parameter of an integrated circuit design, the integrated circuit design having a plurality of power bus nodes, the instructions comprising:
(a) a first set of instructions for determining a plurality of current waveforms, each of said plurality of waveforms corresponding to one of a plurality of aggressor objects in the design of the integrated circuit;
(b) a second set of instructions for applying each of said plurality of current waveforms to a subset of the plurality of power bus nodes, said subset of the plurality of power bus nodes being designed to supply power to a corresponding one of said plurality of aggressor objects;
(c) a third set of instructions for determining a plurality of voltage waveforms, each of said plurality of voltage waveforms being at one of said plurality of power bus nodes and corresponding to one of said plurality of current waveforms;
(d) a fourth set of instructions for determining a logical expression to specify at least one subset of said plurality of current waveforms that can occur together; and
(e) a fifth set of instructions for using said plurality of voltage waveforms and said logical expression to determine the extreme value.

16. A computer readable medium according to claim 15, wherein said logical expression comprises a binary decision diagram.

17. A computer readable medium according to claim 16, wherein said binary decision diagram comprises a plurality of binary decision nodes and wherein said using step (e) further comprises:
i. computing for each binary decision node a partial extreme value;
ii. using said partial extreme values to determine the extreme value.

18. A computer readable medium according to claim 15, wherein said extreme value is a static timing analysis value.

19. A computer readable medium according to claim 18, wherein said fifth set of instructions comprises a sixth set of instructions for determining a delay for at least one delay arc using one or more of said plurality of voltage waveforms and a block-based statistical timing analysis, said block-based statistical timing analysis having a plurality of statistical parameters, each of said plurality of statistical parameters representing an activity of one of said plurality of aggressor objects.

20. A computer readable medium according to claim 19, wherein said fifth set of instructions further comprises:
i. a seventh set of instructions for determining a plurality of slack variation values, each of said plurality of slack variation values corresponding to one of said plurality of statistical parameters;
ii. an eight set of instructions for using said plurality of slack variation values and said logical function to determine a worst case slack of at least one timing test using.

21. A computer readable medium according to claim 15, wherein said extreme value is a voltage extreme at a selected one of said plurality of power bus nodes.

22. A computer readable medium according to claim 21, wherein said fifth set of instructions comprises
i. a ninth set of instructions for determining a subset of said plurality of voltage waveforms corresponding to said selected one of said plurality of power bus nodes, each of said subset of said plurality of voltage waveforms having one or more clock cycles;
ii. a tenth set of instruction for determining a plurality of voltage values, each of said plurality of voltage values being at one of a plurality of intervals of said one or more clock cycles; and
iii. an eleventh set of instructions for determining an extreme voltage value for said selected one of said plurality of power bus nodes from said plurality of voltage values.

23. A computer readable medium according to claim 15, wherein at least one of said plurality of voltage waveforms has a duration of more than one clock cycle, and wherein said logical expression accounts for a subset of said more than one clock cycle in which each of said current waveforms can occur.

24. A computer readable medium according to claim 15, further comprising a twelfth set of instructions for modifying the integrated circuit design such that a previously allowed subset of said plurality of current waveforms can no longer occur together.

25. A computer readable medium containing computer executable instructions implementing a method of determining voltage extremes at a power bus node of an integrated circuit design, the integrated circuit design having a plurality of power bus nodes, the instructions comprising:

(a) a first set of instructions for determining a plurality of current waveforms, each of said plurality of waveforms corresponding to one of a plurality of aggressor objects in the design of the integrated circuit;

(b) a second set of instructions for applying each of said plurality of current waveforms to a subset of the plurality of power bus nodes, said subset of the plurality of power bus nodes being designed to supply power to a corresponding one of said plurality of aggressor objects;

(c) a third set of instructions for determining a plurality of voltage waveforms at a selected one of said plurality of power bus nodes for each said plurality of current waveforms applied, each of said plurality of voltage waveforms having one or more clock cycles; and (d) a fourth set of instructions for using said plurality of voltage waveforms to determine an extreme voltage value for said selected one of said plurality of power bus nodes.

26. A method according to claim 25, wherein said fourth set of instructions comprises:

i. a fifth set of instructions for determining a plurality of voltage values, each of said plurality of voltage values being at one of a plurality of intervals of said one or more clock cycles; and ii. a sixth set of instructions for determining an extreme voltage value for said selected one of said plurality of power bus nodes from said plurality of voltage values.

27. A method according to claim 26, further comprising a seventh set of instructions for determining a logical expression to specify at least one subset of said plurality of current waveforms that occur together.

28. A method according to claim 27, wherein said logical expression comprises a binary decision diagram.

* * * * *